(12) United States Patent
Maxim et al.

(10) Patent No.: US 12,381,525 B2
(45) Date of Patent: Aug. 5, 2025

(54) AMPLIFIER SYSTEM

(71) Applicant: Qorvo US, Inc., Greensboro, NC (US)

(72) Inventors: George Maxim, Saratoga, CA (US); Nadim Khlat, Cugnaux (FR); Baker Scott, San Jose, CA (US); Kevin Wesley Kobayashi, Redondo Beach, CA (US)

(73) Assignee: Qorvo US, Inc., Greensboro, NC (US)

( * ) Notice: Subject to any disclaimer, the term of this patent is extended or adjusted under 35 U.S.C. 154(b) by 164 days.

(21) Appl. No.: 18/334,431

(22) Filed: Jun. 14, 2023

(65) Prior Publication Data

US 2023/0421120 A1 Dec. 28, 2023

Related U.S. Application Data

(60) Provisional application No. 63/356,235, filed on Jun. 28, 2022.

(51) Int. Cl.
*H03F 3/24* (2006.01)
*H03F 1/02* (2006.01)
*H03F 1/56* (2006.01)

(52) U.S. Cl.
CPC ........... *H03F 3/245* (2013.01); *H03F 1/0261* (2013.01); *H03F 1/56* (2013.01); *H03F 2200/451* (2013.01)

(58) Field of Classification Search
CPC ...... H03F 3/195; H03F 1/0261; H03F 1/3288; H03F 1/0266; H03F 1/3205;
(Continued)

(56) References Cited

U.S. PATENT DOCUMENTS 4,797,898 A * 1/1989 Martinez ................ H04B 3/141
375/230
5,793,821 A 8/1998 Norrell et al.
(Continued)

FOREIGN PATENT DOCUMENTS

BR 112015001348 B1 * 12/2021 ........... H03F 1/3247
CA 2291863 C * 11/2006 ........... H03F 1/3247
(Continued)

OTHER PUBLICATIONS

S. Kim and D. Im, "A tunable power amplifier employing digitally controlled accumulation-mode varactor array for 2.4-GHz short-range wireless communication," 2016 IEEE Asia Pacific Conference on Circuits and Systems (APCCAS), Jeju, Korea (South), 2016, pp. 269-272, (Year: 2016).*
(Continued)

*Primary Examiner* — Berhanu Tadese
(74) *Attorney, Agent, or Firm* — Withrow & Terranova, P.L.L.C.

(57) ABSTRACT

The present disclosure relates to an amplifier system having an output amplifier stage with a signal input and output, and a varactor with a capacitive output that is coupled to the signal input for adjusting input capacitance. The amplifier system also includes push varactor bias circuitry with a bias level output that is coupled to a tuning input, and a bias control input. The push varactor bias circuitry is configured to adjust bias voltage at the tuning input and thereby adjust the capacitance at the signal input by way of the varactor and reduce signal distortion at the signal output in response to a distortion compensation signal received at the bias control input.

28 Claims, 14 Drawing Sheets

(58) Field of Classification Search
CPC ........ H03F 1/3211; H03F 3/213; H03F 3/211; H03F 3/245; H03F 1/56; H03F 1/3247; H03F 1/0272; H03F 2200/105; H03F 2200/318; H03F 2200/451

See application file for complete search history.

(56) References Cited

U.S. PATENT DOCUMENTS

| | | | | |
|---|---|---|---|---|
| 6,166,601 | A * | 12/2000 | Shalom | H03F 1/3247 330/149 |
| 6,275,685 | B1 * | 8/2001 | Wessel | H03F 1/3282 330/149 |
| 6,630,862 | B1 | 10/2003 | Perthold et al. | |
| 6,760,451 | B1 | 7/2004 | Craven et al. | |
| 6,806,767 | B2 * | 10/2004 | Dow | H03F 1/30 330/306 |
| 6,947,711 | B1 | 9/2005 | Leyonhjelm | |
| 7,076,225 | B2 * | 7/2006 | Li | H03G 3/3068 455/296 |
| 7,170,342 | B2 | 1/2007 | Suzuki et al. | |
| 7,202,736 | B1 * | 4/2007 | Dow | H03F 1/30 330/129 |
| 7,430,248 | B2 * | 9/2008 | McCallister | H04L 27/3411 375/295 |
| 7,443,236 | B2 * | 10/2008 | Dow | H03F 1/56 330/129 |
| 7,583,754 | B2 * | 9/2009 | Liu | H03F 1/3258 375/295 |
| 7,663,436 | B2 * | 2/2010 | Takano | H03F 1/30 330/289 |
| 7,683,713 | B2 * | 3/2010 | Hongo | H03F 1/3241 330/149 |
| 7,755,429 | B2 | 7/2010 | Nguyen et al. | |
| 7,859,338 | B2 * | 12/2010 | Bajdechi | H03F 3/45192 330/253 |
| 7,889,820 | B2 * | 2/2011 | Murthy | H04L 27/2657 375/345 |
| 7,978,009 | B2 * | 7/2011 | Mu | H03F 1/56 330/253 |
| 8,493,141 | B2 | 7/2013 | Khlat et al. | |
| 8,605,819 | B2 * | 12/2013 | Lozhkin | H03F 1/3247 375/295 |
| 8,649,745 | B2 | 2/2014 | Bai et al. | |
| 8,749,309 | B2 * | 6/2014 | Ho | H03G 1/007 330/296 |
| 8,831,544 | B2 * | 9/2014 | Walker | H03F 3/68 455/127.1 |
| 8,884,692 | B2 | 11/2014 | Lee | |
| 9,001,947 | B2 * | 4/2015 | Wyville | H04B 1/109 375/349 |
| 9,036,734 | B1 | 5/2015 | Mauer | H04B 1/0475 375/295 |
| 9,065,504 | B2 * | 6/2015 | Kwon | H03F 3/24 |
| 9,112,413 | B2 * | 8/2015 | Barth | H02M 5/293 |
| 9,356,760 | B2 * | 5/2016 | Larsson | H04L 1/1607 |
| 9,391,565 | B2 * | 7/2016 | Scott | H03H 7/09 |
| 9,438,196 | B2 * | 9/2016 | Smith | H03H 7/06 |
| 9,461,596 | B1 * | 10/2016 | Ozard | H03F 1/3247 |
| 9,560,595 | B2 * | 1/2017 | Dakshinamurthy | H04W 52/0251 |
| 9,692,366 | B2 * | 6/2017 | Pilgram | H03F 3/24 |
| 9,705,477 | B2 * | 7/2017 | Velazquez | H04L 25/14 |
| 9,973,370 | B1 | 5/2018 | Langer et al. | |
| 10,177,719 | B2 * | 1/2019 | Gazneli | H03F 1/3247 |
| 10,181,478 | B2 * | 1/2019 | Scott | H10D 86/441 |
| 10,305,435 | B1 | 5/2019 | Murugesu et al. | |
| 10,326,408 | B2 * | 6/2019 | Khlat | H03F 1/0222 |
| 10,333,479 | B2 * | 6/2019 | Scott | H03F 3/195 |
| 10,361,744 | B1 * | 7/2019 | Khlat | H04B 17/13 |
| 10,476,437 | B2 | 11/2019 | Nag et al. | |
| 10,778,345 | B2 * | 9/2020 | El-Hassan | H04L 5/001 |
| 11,005,368 | B2 * | 5/2021 | Bansal | H03F 3/245 |
| 11,088,660 | B2 * | 8/2021 | Lin | H03F 3/2173 |
| 11,387,789 | B2 * | 7/2022 | Khlat | H03F 3/245 |
| 11,424,719 | B2 * | 8/2022 | Khlat | H03F 1/0233 |
| 11,483,186 | B2 * | 10/2022 | Casper | H04L 25/03847 |
| 11,569,783 | B2 * | 1/2023 | Nomiyama | H02M 3/156 |
| 11,637,531 | B1 | 4/2023 | Perreault et al. | |
| 2001/0022532 | A1 * | 9/2001 | Dolman | H04L 27/368 330/149 |
| 2001/0054974 | A1 | 12/2001 | Wright | |
| 2002/0190811 | A1 | 12/2002 | Sperber | |
| 2003/0042979 | A1 | 3/2003 | Gurvich et al. | |
| 2004/0239446 | A1 | 12/2004 | Gurvich et al. | |
| 2005/0100105 | A1 * | 5/2005 | Jensen | H04L 27/368 375/259 |
| 2005/0254659 | A1 | 11/2005 | Heinsen | |
| 2006/0068710 | A1 * | 3/2006 | Jensen | H04L 25/03343 455/63.1 |
| 2006/0209981 | A1 * | 9/2006 | Kluesing | H04L 27/205 375/279 |
| 2006/0217083 | A1 * | 9/2006 | Braithwaite | H03F 1/3282 455/114.3 |
| 2007/0032208 | A1 * | 2/2007 | Choi | H03F 1/02 455/114.3 |
| 2008/0009258 | A1 | 1/2008 | Safarian et al. | |
| 2008/0074209 | A1 | 3/2008 | Ceylan et al. | |
| 2008/0161073 | A1 * | 7/2008 | Park | H04B 1/1607 455/574 |
| 2008/0246550 | A1 * | 10/2008 | Biedka | H03C 5/00 332/149 |
| 2009/0004981 | A1 | 1/2009 | Eliezer et al. | |
| 2009/0061787 | A1 | 3/2009 | Koller et al. | |
| 2009/0074106 | A1 * | 3/2009 | See | H04L 27/362 375/300 |
| 2009/0125264 | A1 | 5/2009 | Betts et al. | |
| 2009/0141830 | A1 | 6/2009 | Ye | |
| 2009/0232260 | A1 | 9/2009 | Hayashi et al. | |
| 2009/0302945 | A1 | 12/2009 | Catoiu et al. | |
| 2010/0135439 | A1 | 6/2010 | Lackey | |
| 2010/0298030 | A1 * | 11/2010 | Howard | H04L 25/03343 375/296 |
| 2011/0095826 | A1 | 4/2011 | Hadjichristos et al. | |
| 2011/0182347 | A1 * | 7/2011 | Cheung | H04B 3/06 375/232 |
| 2011/0227767 | A1 | 9/2011 | O'Brien | |
| 2012/0068748 | A1 | 3/2012 | Stojanovic et al. | |
| 2012/0139635 | A1 | 6/2012 | Ho et al. | |
| 2012/0189081 | A1 * | 7/2012 | Omoto | H04L 27/36 375/298 |
| 2012/0244824 | A1 | 9/2012 | Entezari et al. | |
| 2012/0256688 | A1 * | 10/2012 | Onishi | H03F 1/0244 330/149 |
| 2013/0141062 | A1 * | 6/2013 | Khlat | H03F 3/24 323/271 |
| 2013/0214858 | A1 | 8/2013 | Tournatory et al. | |
| 2013/0222057 | A1 | 8/2013 | Henshaw | |
| 2013/0243129 | A1 | 9/2013 | Okuni et al. | |
| 2014/0028368 | A1 * | 1/2014 | Khlat | H03H 7/0107 327/311 |
| 2014/0029683 | A1 | 1/2014 | Morris et al. | |
| 2014/0062590 | A1 | 3/2014 | Khlat et al. | |
| 2014/0062599 | A1 | 3/2014 | Xu et al. | |
| 2014/0065989 | A1 * | 3/2014 | McLaurin | H03F 3/189 455/114.3 |
| 2014/0072307 | A1 | 3/2014 | Zamani et al. | |
| 2014/0084996 | A1 * | 3/2014 | Schwent | H03F 1/0222 327/551 |
| 2014/0105264 | A1 * | 4/2014 | McLaurin | H04B 17/11 375/224 |
| 2014/0184337 | A1 * | 7/2014 | Nobbe | H03D 1/18 330/296 |
| 2014/0213196 | A1 * | 7/2014 | Langer | H03G 1/00 455/73 |
| 2014/0232470 | A1 * | 8/2014 | Wilson | H03F 1/00 330/297 |
| 2014/0266432 | A1 * | 9/2014 | Scott | H03F 3/211 330/149 |
| 2014/0315504 | A1 * | 10/2014 | Sakai | H03F 3/189 455/127.2 |

(56) References Cited

U.S. PATENT DOCUMENTS

| | | |
|---|---|---|
| 2014/0361837 A1 | 12/2014 | Strange et al. |
| 2015/0028946 A1* | 1/2015 | Al-Qaq .................. H03F 3/24 |
| | | 330/149 |
| 2015/0126142 A1 | 5/2015 | Meredith |
| 2015/0333781 A1 | 11/2015 | Alon et al. |
| 2016/0173030 A1* | 6/2016 | Langer ..................... H03F 1/30 |
| | | 330/250 |
| 2016/0174293 A1 | 6/2016 | Mow et al. |
| 2016/0182099 A1 | 6/2016 | Boddupally et al. |
| 2016/0182100 A1* | 6/2016 | Menkhoff ........... H04W 72/541 |
| | | 375/297 |
| 2016/0301432 A1* | 10/2016 | Shizawa .............. H03F 1/3241 |
| 2016/0322992 A1 | 11/2016 | Okawa et al. |
| 2017/0005676 A1* | 1/2017 | Yan ......................... H03F 3/24 |
| 2017/0104502 A1 | 4/2017 | Pratt |
| 2017/0149457 A1 | 5/2017 | Mayer et al. |
| 2017/0170838 A1 | 6/2017 | Pagnanelli |
| 2017/0230924 A1* | 8/2017 | Wolberg ................ H03F 3/195 |
| 2017/0338842 A1* | 11/2017 | Pratt .................... H03F 1/3294 |
| 2017/0353197 A1 | 12/2017 | Ruffieux et al. |
| 2018/0034418 A1 | 2/2018 | Blednov |
| 2018/0175813 A1* | 6/2018 | Scott ..................... H03F 1/3211 |
| 2018/0197881 A1* | 7/2018 | Scott .................... H01L 23/4824 |
| 2018/0226923 A1 | 8/2018 | Nagamori |
| 2018/0248570 A1* | 8/2018 | Camuffo .................. H03F 3/19 |
| 2019/0041890 A1* | 2/2019 | Chen ...................... H03F 3/189 |
| 2019/0058530 A1 | 2/2019 | Rainish et al. |
| 2019/0068234 A1* | 2/2019 | Khlat ..................... H04B 1/40 |
| 2019/0097671 A1* | 3/2019 | Dimpflmaier ............ H03F 3/19 |
| 2019/0238152 A1 | 8/2019 | Pagnanelli |
| 2019/0245496 A1* | 8/2019 | Khlat .................... H04B 7/0456 |
| 2019/0296929 A1* | 9/2019 | Milicevic ............... H04B 1/1018 |
| 2019/0319583 A1* | 10/2019 | El-Hassan ............... H03F 3/245 |
| 2019/0356285 A1* | 11/2019 | Khlat ........................ H03F 3/68 |
| 2020/0106392 A1* | 4/2020 | Khlat .................... H03F 1/0227 |
| 2020/0119699 A1 | 4/2020 | Nishihara et al. |
| 2020/0136563 A1* | 4/2020 | Khlat .................... H03F 1/0233 |
| 2020/0136568 A1 | 4/2020 | Hosoda et al. |
| 2020/0162030 A1* | 5/2020 | Drogi ...................... H03F 3/245 |
| 2020/0204422 A1 | 6/2020 | Khlat |
| 2020/0259685 A1* | 8/2020 | Khlat ................ H04L 25/03828 |
| 2020/0295713 A1* | 9/2020 | Khlat ..................... H03M 1/12 |
| 2020/0336111 A1 | 10/2020 | Khlat |
| 2021/0058970 A1* | 2/2021 | Kwak ................... H04W 72/23 |
| 2021/0067097 A1 | 3/2021 | Wang et al. |
| 2021/0099136 A1* | 4/2021 | Drogi ...................... H03F 3/245 |
| 2021/0143859 A1 | 5/2021 | Hageraats et al. |
| 2021/0194517 A1* | 6/2021 | Mirea ....................... H03F 3/24 |
| 2021/0194740 A1* | 6/2021 | Aldana ................. H04W 16/14 |
| 2021/0281228 A1* | 9/2021 | Khlat .................... H03F 1/0238 |
| 2021/0399690 A1* | 12/2021 | Panseri .................... H03F 3/19 |
| 2022/0021348 A1 | 1/2022 | Philpott et al. |
| 2022/0216834 A1* | 7/2022 | Myoung ................ H04B 1/0475 |
| 2022/0360229 A1* | 11/2022 | Khlat .................... H03F 1/0238 |
| 2022/0407462 A1* | 12/2022 | Khlat .................... H03F 1/0227 |
| 2022/0407463 A1* | 12/2022 | Khlat ................. H04L 25/03993 |
| 2022/0407464 A1* | 12/2022 | Khlat .................... H03F 3/195 |
| 2022/0407465 A1* | 12/2022 | Khlat .................... H03F 1/0227 |
| 2022/0407478 A1* | 12/2022 | Khlat .................... H03F 3/245 |
| 2022/0416730 A1* | 12/2022 | Su ........................ H03F 1/0222 |
| 2023/0065760 A1 | 3/2023 | Hellberg |
| 2023/0079153 A1* | 3/2023 | Khlat .................... H03F 1/3288 |
| | | 455/552.1 |
| 2023/0080621 A1* | 3/2023 | Khlat ................. H04L 25/03261 |
| | | 375/232 |
| 2023/0080652 A1* | 3/2023 | Khlat ................... H04B 17/0085 |
| | | 455/552.1 |
| 2023/0081095 A1* | 3/2023 | Khlat .................... H03F 3/265 |
| | | 327/540 |
| 2023/0082145 A1* | 3/2023 | Lin ..................... C23C 14/3414 |
| | | 204/298.13 |
| 2023/0155614 A1 | 5/2023 | Jelonnek et al. |
| 2023/0238927 A1* | 7/2023 | Kay ....................... H03F 3/245 |
| | | 330/136 |
| 2023/0318537 A1* | 10/2023 | Scott ..................... H03F 1/3276 |
| | | 330/136 |
| 2023/0387859 A1* | 11/2023 | Drogi ..................... H03F 3/195 |
| 2023/0387860 A1* | 11/2023 | Khlat ..................... H03F 3/195 |
| 2023/0387861 A1* | 11/2023 | Maxim ................... H03F 3/213 |
| 2023/0421110 A1* | 12/2023 | Maxim ................... H03F 3/211 |
| 2023/0421111 A1* | 12/2023 | Khlat ....................... H03F 3/20 |
| 2023/0421112 A1* | 12/2023 | Scott ..................... H03F 1/3282 |
| 2023/0421120 A1* | 12/2023 | Maxim ................... H03F 3/195 |
| 2024/0372665 A1* | 11/2024 | Khoryaev ............. H04L 5/0053 |
| 2024/0426954 A1* | 12/2024 | Guan ................... G01R 33/3621 |

FOREIGN PATENT DOCUMENTS

| | | | | |
|---|---|---|---|---|
| CN | 1151229 A | * | 6/1997 | ........... H03F 1/3252 |
| CN | 1550064 A | * | 11/2004 | ........... H03F 1/3247 |
| CN | 1706096 A | * | 12/2005 | ........... H03F 1/3241 |
| CN | 1326321 C | * | 7/2007 | ........... H03F 1/3247 |
| CN | 100550870 C | * | 10/2009 | .............. H03F 1/32 |
| CN | 101036289 B | * | 5/2010 | ........... H03F 1/3276 |
| CN | 101651459 B | * | 2/2013 | |
| CN | 104584501 A | * | 4/2015 | ........... H03F 1/3247 |
| CN | 105812073 A | | 7/2016 | |
| CN | 107483021 A | | 12/2017 | |
| CN | 110798155 A | | 2/2020 | |
| CN | 111064438 A | * | 4/2020 | .............. H03F 3/20 |
| CN | 210693998 U | | 6/2020 | |
| CN | 112995079 A | | 6/2021 | |
| CN | 113055324 A | * | 6/2021 | ............. H04L 25/49 |
| CN | 113659938 A | * | 11/2021 | |
| CN | 113055324 B | * | 12/2021 | ............. H04L 25/49 |
| CN | 110855251 B | * | 4/2023 | ........... H03F 1/3241 |
| CN | 116015223 A | * | 4/2023 | |
| CN | 113659938 B | * | 5/2023 | |
| CN | 116794580 A | * | 9/2023 | ............. A61B 5/055 |
| CN | 116896331 A | * | 10/2023 | ........... H03F 1/0222 |
| CN | 117134711 A | * | 11/2023 | ........... H03F 1/0222 |
| CN | 118117977 A | * | 5/2024 | ........... H03F 1/3205 |
| CN | 118648236 A | * | 9/2024 | ........... H03F 1/0227 |
| CN | 118648238 A | * | 9/2024 | ........... H03F 1/3241 |
| CN | 118872201 A | * | 10/2024 | ........... H03F 1/0266 |
| CN | 118117977 B | * | 11/2024 | ........... H03F 1/3205 |
| CN | 119072847 A | * | 12/2024 | ........... H03F 1/3247 |
| CN | 119096468 A | * | 12/2024 | ........... H03F 1/0222 |
| EP | 1011192 A2 | * | 6/2000 | ........... H03F 1/3247 |
| EP | 1573993 A1 | * | 9/2005 | .............. H03F 1/32 |
| EP | 1573993 B1 | * | 1/2010 | .............. H03F 1/32 |
| EP | 2705604 A2 | | 3/2014 | |
| EP | 2582041 B1 | | 4/2018 | |
| EP | 2232713 B1 | | 10/2018 | |
| EP | 3416340 A1 | | 12/2018 | |
| EP | 4254787 A1 | * | 10/2023 | ........... H03F 1/0222 |
| EP | 4293897 A2 | * | 12/2023 | ........... H03F 1/0222 |
| JP | 2011211533 A | | 10/2011 | |
| JP | 2015099972 A | | 5/2015 | |
| JP | 6542120 B2 | * | 7/2019 | ........... H03F 1/3247 |
| WO | 2007092794 A2 | | 8/2007 | |
| WO | 2010011551 A2 | | 1/2010 | |
| WO | 2010135711 A1 | | 11/2010 | |
| WO | WO-2011015533 A1 | * | 2/2011 | .............. H03F 1/56 |
| WO | WO-2013104977 A1 | * | 7/2013 | ............. H04B 1/109 |
| WO | 2014026178 A1 | | 2/2014 | |
| WO | 2021042088 A2 | | 3/2021 | |
| WO | 2023147211 A1 | | 8/2023 | |
| WO | 2023150545 A1 | | 8/2023 | |
| WO | 2023150587 A1 | | 8/2023 | |
| WO | WO-2023150539 A1 | * | 8/2023 | ........... H03F 1/3241 |
| WO | 2023235070 A1 | | 12/2023 | |
| WO | 2023249771 A1 | | 12/2023 | |
| WO | 2023249889 A1 | | 12/2023 | |

OTHER PUBLICATIONS

R. Wanner, R. Lachner and G. R. Olbrich, "Monolithically Integrated SiGe Push-Push Oscillators in the Frequency Range 50-190 GHz," 2006 IEEE Ninth International Symposium on Spread Spec-

(56) References Cited

OTHER PUBLICATIONS trum Techniques and Applications, Manaus, Brazil, 2006, pp. 26-30, (Year: 2006).*

T.-P. Wang, "A fully integrated w-band push-push CMOS VCO with low phase noise and wide tuning range," in IEEE Transactions on Ultrasonics, Ferroelectrics, and Frequency Control, vol. 58, No. 7, pp. 1307-1319, Jul. 2011, (Year: 2011).*

J.-S. Fu and A. Mortazawi, "Power Amplifier Efficiency and Linearity Using a Dynamically Controlled Tunable Matching Network," in IEEE Transactions on Microwave Theory and Techniques, vol. 56, No. 12, pp. 3239-3244, Dec. 2008, (Year: 2008).*

W.-D. Bai, D.-W. Zhang and H.-L. Deng, "Principle of vector synthesis predistortion linearizers controlling AM/AM and AM/PM independently," 2016 IEEE International Conference on Ubiquitous Wireless Broadband (ICUWB), Nanjing, China, 2016 (Year: 2016).*

International Search Report and Written Opinion for International Patent Application No. PCT/US2022/043600, mailed Jan. 11, 2023, 15 pages.

Non-Final Office Action for U.S. Appl. No. 17/942,472, mailed Feb. 16, 2023, 13 pages.

Extended European Search Report for European Patent Application No. 22195382.1, mailed Feb. 1, 2023, 26 pages.

Extended European Search Report for European Patent Application No. 22195683.2, mailed Feb. 10, 2023, 12 pages.

Non-Final Office Action for U.S. Appl. No. 17/700,700, mailed Apr. 13, 2023, 11 pages.

Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.

Extended European Search Report for European Patent Application No. 22195695.6, mailed Feb. 14, 2023, 12 pages.

Extended European Search Report for European Patent Application No. 22196188.1, mailed Feb. 2, 2023, 25 pages.

International Search Report and Written Opinion for International Patent Application No. PCT/US2023/060303, mailed Apr. 11, 2023, 12 pages.

Final Office Action for U.S. Appl. No. 17/942,472, mailed Jul. 19, 2023, 16 pages.

Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.

Advisory Action for U.S. Appl. No. 17/942,472, mailed Sep. 15, 2023, 3 pages.

Notice of Allowance for U.S. Appl. No. 17/942,472, mailed Oct. 18, 2023, 10 pages.

International Search Report and Written Opinion for International Patent Application No. PCT/US2023/019267, mailed Aug. 3, 2023, 14 pages.

Williams, P., "Crossover Filter Shape Comparisons," White Paper, Linea Research, Jul. 2013, 13 pages.

Corrected Notice of Allowability for U.S. Appl. No. 17/942,472, mailed Nov. 17, 2023, 6 pages.

Non-Final Office Action for U.S. Appl. No. 17/939,350, mailed Jan. 17, 2024, 11 pages.

Kwak, T.-W. et al., "A 2W CMOS Hybrid Switching Amplitude Modulator for Edge Polar Transmitters," IEEE Journal of Solid-State Circuits, vol. 42, No. 12, Dec. 2007, IEEE, pp. 2666-2676.

Paek, J.-S. et al., "A—137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.

Non-Final Office Action for U.S. Appl. No. 17/737,300, mailed Aug. 28, 2023, 14 pages.

Extended European Search Report for European Patent Application No. 23153108.8, mailed Jun. 20, 2023, 18 pages.

Notice of Allowance for U.S. Appl. No. 17/700,685, mailed Apr. 5, 2024, 7 pages.

Final Office Action for U.S. Appl. No. 17/689,232, mailed Mar. 26, 2024, 28 pages.

Supplemental Notice of Allowability for U.S. Appl. No. 17/700,700, mailed Feb. 28, 2024, 5 pages.

Hammi et al., "Temperature Compensated Digital Predistorter for 3G Power Amplifiers," Electronics, Circuit and Systems, 2005, Dec. 11, 2005, pp. 1-4.

Hao et al., "Hybrid Analog/Digital Linearization Based on Dual-Domain Decomposition of Nonlinearity," 2019 IEEE Asia-Pacific Microwave Conference, Dec. 10, 2019, pp. 156-158.

Lee et al., "Fully Automated Adaptive Analog Predistortion Power Amplifier in WCDMA Applications," 2005 European Microwave Conference CNIT La Defense, Paris, France, vol. 2, Oct. 4, 2005, pp. 967-970.

Li et al., "Analog Predistorter Averaged Digital Predistortion for Power Amplifiers in Hybrid Beam-Forming Multi-Input Multi-Output Transmitter," IEEE Access, vol. 8, Aug. 1, 2020, pp. 146145-146153.

Tome et al., "Hybrid Analog/Digital Linearizatio nof GaN HEMT-Based Power Amplifiers," IEEE Transactions on Microwave Theory and Techniques, vol. 67, No. 1, Jan. 1, 2019, pp. 288-294.

Notice of Allowance for U.S. Appl. No. 17/689,232, mailed Oct. 21, 2024, 10 pages.

Notice of Allowance for U.S. Appl. No. 17/714,244, mailed Sep. 16, 2024, 8 pages.

Non-Final Office Action for U.S. Appl. No. 17/939,350, mailed Sep. 6, 2024, 8 pages.

Non-Final Office Action for U.S. Appl. No. 17/890,538, mailed Oct. 21, 2024, 13 pages.

Notice of Allowance and Examiner-Initiated Interview Summary for U.S. Appl. No. 17/700,826, mailed Sep. 11, 2024, 10 pages.

International Search Report and Written Opinion for International Patent Application No. PCT/US2023/060803, mailed May 19, 2023, 13 pages.

International Search Report and Written Opinion for International Patent Application No. PCT/US2023/060804, mailed May 4, 2023, 19 pages.

International Search Report and Written Opinion for International Patent Application No. PCT/US2023/025512, mailed Sep. 28, 2023, 13 pages.

Advisory Action U.S. Appl. No. 17/689,232, mailed May 23, 2024, 3 pages.

Non-Final Office Action for U.S. Appl. No. 17/689,232, mailed Jul. 17, 2024, 22 pages.

Final Office Action for U.S. Appl. No. 17/939,350, mailed May 21, 2024, 11 pages.

Non-Final Office Action for U.S. Appl. No. 17/700,826, mailed May 15, 2024, 28 pages.

International Search Report and Written Opinion for International Patent Application No. PCT/US2023/061734, mailed May 30, 2023, 15 pages.

International Search Report and Written Opinion for International Patent Application No. PCT/US2023/061741, mailed Jun. 1, 2023, 14 pages.

Invitation to Pay Additional Fees and Partial International Search for International Patent Application No. PCT/US2023/061804, mailed May 26, 2023, 10 pages.

International Search Report and Written Opinion for International Patent Application No. PCT/US2023/061804, mailed Jul. 17, 2023, 20 pages.

Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.

Non-Final Office Action for U.S. Appl. No. 17/700,685, mailed Dec. 22, 2023, 24 pages.

Non-Final Office Action for U.S. Appl. No. 17/689,232, mailed Dec. 11, 2023, 27 pages.

(56) References Cited

OTHER PUBLICATIONS

Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.

* cited by examiner

AMPLIFIER SYSTEM

RELATED APPLICATIONS

This application claims the benefit of provisional patent application Ser. No. 63/356,235, filed Jun. 28, 2022, the disclosure of which is hereby incorporated herein by reference in its entirety.

FIELD OF THE DISCLOSURE

The present disclosure relates to power amplifiers and in particular to power amplifiers and supporting circuitry configured to increase the linearity thereof.

BACKGROUND

Phase distortion is one of the main limiting factors in modern 5G power amplifiers. It is generally difficult to perform a high-accuracy amplitude modulation-phase modulation (AM-PM) phase linearization due to the dependency of the phase distortion on multiple environment factors: power amplifier temperature, post-power amplifier filter used, and frequency band or sub-band of operation. Baseband digital pre-distortion (DPD) AM-PM phase linearization was implemented in the past, but it needs a large amount of memory to save different DPD coefficients for each specific power amplifier operation condition.

The power amplifier AM-PM distortion can be corrected with baseband DPD. However, the AM-PM distortion varies with a number of parameters, including the power amplifier supply voltage (VCC), the power amplifier temperature, and power amplifier process, part-to-part. This makes the DPD AM-PM correction much more difficult and the calibration process more complicated.

Different DPD coefficient sets are required for all these multi-dimensional parameters that impact the AM-PM distortion. This leads to an exponential growth of the memory needed for the DPD.

Most of the parameters that impact AM-PM can be detected inside the front-end module (FEM). Therefore, using analog pre-distortion (APD) in the FEM to correct for the power amplifier AM-PM results in a more accurate linearization. Different sensors can be used in the APD AM-PM.

Since most of the phase distortion is contributed by the last power amplifier stage which is implemented usually in bipolar processes (e.g., gallium arsenide [GaAs] and gallium nitride [GaN]), the phase APD needs also to be implemented in the bipolar process in order to provide good process tracking, device tracking, and temperature tracking.

SUMMARY

The present disclosure relates to an amplifier system having an output amplifier stage with a signal input and a signal output, and a varactor with a capacitive output that is coupled to the signal input for adjusting input capacitance. The amplifier system also includes push varactor bias circuitry with a bias level output that is coupled to a tuning input, and a bias control input. The push varactor bias circuitry is configured to adjust bias voltage at the tuning input and thereby adjust the capacitance at the signal input by way of the varactor and reduce signal distortion at the signal output in response to a distortion compensation signal received at the bias control input.

The main advantage of the analog phase pre-distorter according to the present disclosure is implementation directly on the same die with the power amplifier, which provides good tracking over process, over temperature, and so on between the main power amplifier devices and the phase pre-distorter devices. This allows a high-accuracy phase correction without the need for complex alignment circuits or calibration circuits.

Key elements of the device according to the present disclosure include, but are not limited to, the following:

A dynamically pushed varactor that can be used to create a sharp analog phase pre-distortion characteristic to compensate the phase nonlinearity of the main power amplifier.

A power amplifier distortion detector circuit that can be used that activates the analog phase pre-distortion.

A dual signal path that can be used to drive the analog pre-distorter, including coupler and delay compensation.

A hybrid digital pre-distortion and analog pre-distortion power amplifier linearization scheme that can be used to incorporate the analog phase pre-distorter.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figures 1A, 1B:
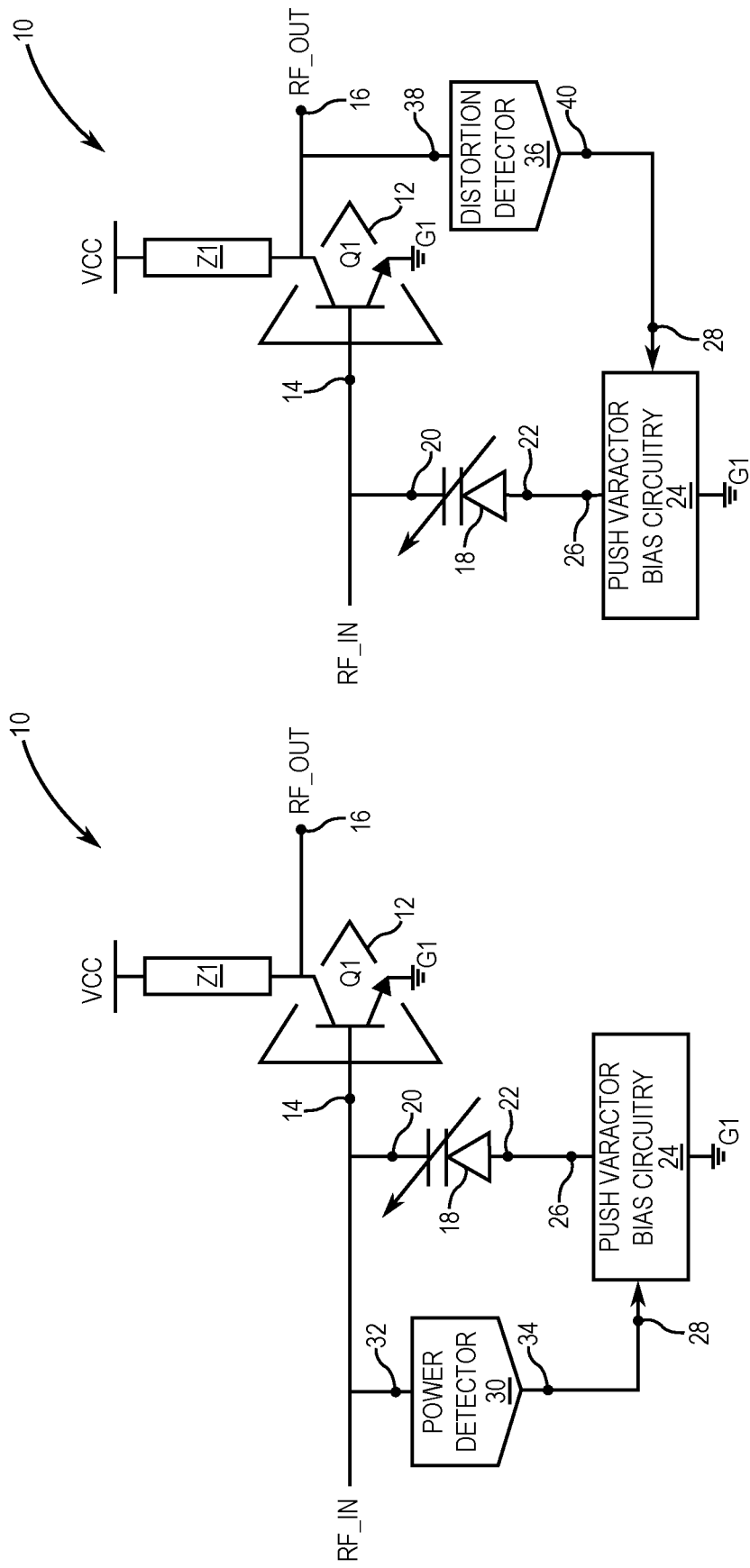
FIG. 1A is a diagram of an embodiment of a power amplifier system of the present disclosure.
FIG. 1B is a diagram of an enhanced embodiment of the power amplifier system of FIG. 1A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure employs analog pre-distortion (APD) directly in the high-power power amplifier die to correct for the AM-PM phase distortion. A substantial advantage is obtained by employing direct power amplifier die-based phase correction strong tracking between the main power amplifier stage and the analog pre-distorter over process and temperature. Since varactors can be implemented from the same type of devices used to realize the power amplification stage, the varactors provide excellent device-to-device tracking.

A fixed bias varactor can be used as an analog pre-distorter. The phase shifting characteristic of the fixed bias varactor is shallow and may start moving the phase at lower signal levels where no correction is needed.

In an alternate embodiment, a dynamically biased pushed-varactor analog phase pre-distorter realizes a steeper phase correction characteristic. The dynamic varactor biasing is performed by a power amplifier detector that senses the power level when the output stage/devices start distorting. A hybrid complementary metal oxide semiconductor—bipolar power amplifier implementation allows the adjustment/adaptation of the analog phase pre-distortion to the operating band or sub-band using mixed-signal circuits.

Since most of the phase distortion is contributed by the last power amplifier stage, which is implemented usually in bipolar processes (e.g., gallium arsenide [GaAs] and gallium nitride [GaN]), the phase APD also needs to be implemented in the bipolar process in order to provide good process tracking, device tracking, and temperature tracking.

Embodiments of a power amplifier system 10 in accordance with the present disclosure are depicted in FIG. 1A and FIG. 1B and show the principle of a pushed varactor that has an additional control path to create a more aggressive C(V) nonlinear compensation capacitance characteristic using a direct power amplifier distortion sensing (e.g., soft compression).

FIG. 1A shows a diagram of one embodiment of the power amplifier system 10 of the present disclosure. The amplifier system 10 has an output amplifier stage 12 having a signal input 14 labeled RF_IN and a signal output 16 labeled RF_OUT. In this exemplary embodiment, the amplifier is depicted as a single bipolar transistor Q1 that has a collector coupled to a supply voltage rail VCC through a first impedance element Z1, which may be a choke coil, a resistor, or a combination of both. The transistor Q1 has an emitter that is coupled to a fixed voltage node such as ground G1. A base of the transistor Q1 is coupled to the signal input 14.

A varactor 18 has a capacitive output 20 coupled to the signal input 14 and includes a tuning input 22. Push varactor bias circuitry 24 has a bias level output 26 coupled to the tuning input 22 and a bias control input 28, wherein the push varactor bias circuitry 24 is configured to adjust bias voltage at the tuning input 22 and thereby adjust capacitance at the signal input 14 and reduce signal distortion at the signal output 16 in response to a distortion compensation signal received at the bias control input 26.

The amplifier system 10 further comprises a power detector 30 having a power detector input 32 coupled to the signal input 14 and a power detector output 34 coupled to the bias control input 28. The power detector 30 is configured to generate the distortion compensation signal based on a detection of an input signal at the signal input 14. The embodiment of FIG. 1A has an advantage of simplicity provided the distortion characteristics for the output stage 12 are accurately known so that the push varactor bias circuitry 24 may have a predetermined activation setpoint associated with input signal power. However, this embodiment does not account for supply voltage changes, process variations, and temperature shifts.

FIG. 1B depicts an embodiment of the power amplifier system 10 that is configured to be self-aligned to be agnostic regarding supply voltage changes, process variations, and temperature shifts. In this embodiment, the power detector 30 coupled to the input 14 is replaced with a distortion detector 36 that has a distortion detector input 38 coupled to the signal output 16 and a distortion detector output 40 coupled to the bias control input 28 of the push varactor bias circuitry 24. In this embodiment, the distortion detector 36 is configured to generate the distortion compensation signal based on a detection of distortion of an output signal at the signal output 16.

Figure 2B:
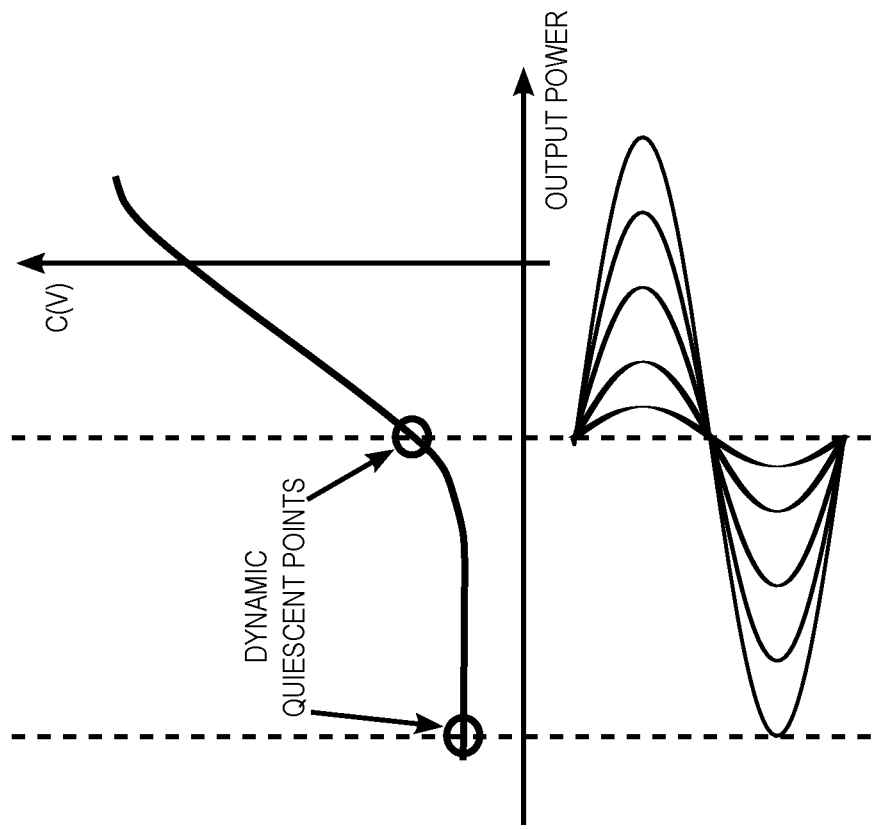
FIG. 2B is a diagram showing the C(V) of a pushed varactor embodiments of the present disclosure that each have an additional control path to create a more aggressive C(V) nonlinear compensation capacitance characteristic using sensing of soft compression.
Figure 2A:
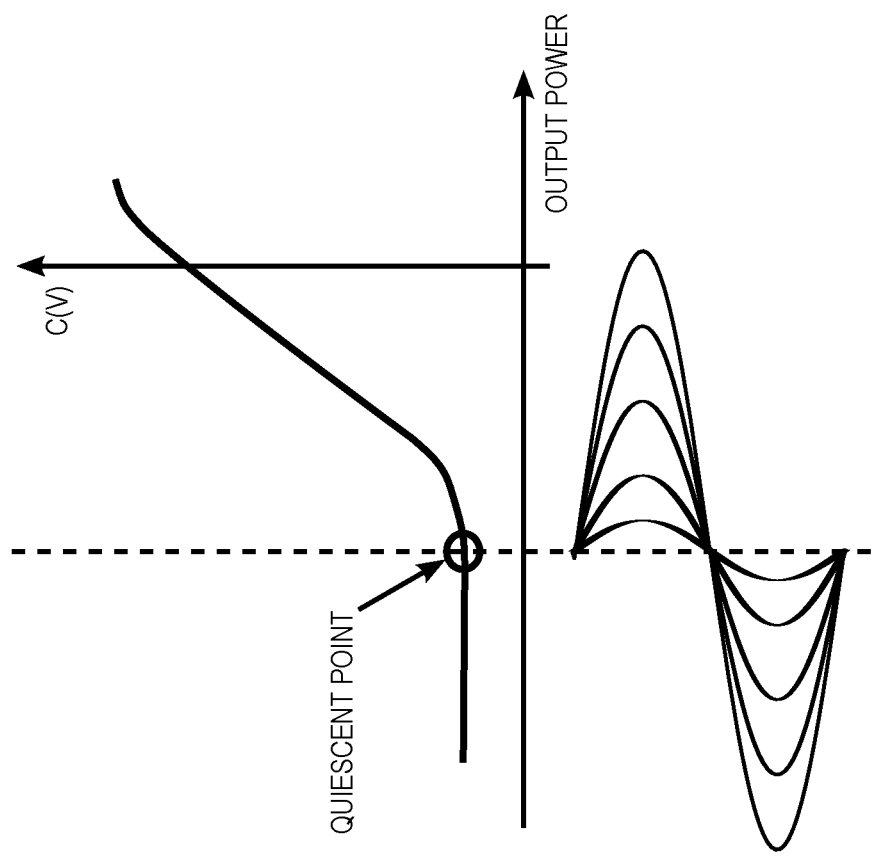
FIG. 2A is a diagram showing a related-art example of capacitance as a function of voltage C(V) for a typical diode varactor.

FIGS. 2A and 2B shows examples of varactor C(V) characteristic (e.g., diode varactor) and the way a standard fixed bias and a dynamic biased varactor, respectively, are operating. The C(V) characteristics are instantaneous capacitance curves. It is important to consider the average capacitance for each radio frequency (RF) cycle. Therefore, the phase correction has a much shallower curve since the equivalent capacitance that provides the phase shift is less abrupt than the instantaneous capacitance curve due to the per-cycle capacitance averaging effect.

Furthermore, a standard fixed biased varactor needs to become fully active at the power levels where phase correction is needed. Due to the shallow nature of the per-cycle capacitance, the fixed biased varactor will still be active at lower power levels where no phase correction is needed.

This is where the dynamically biased varactor has a relatively large advantage. At low and moderate signal levels the varactor is inactive or biased deep into the relatively constant instantaneous C(V) characteristic. As such the varactor capacitance is constant and does not produce any phase shift. When the power amplifier output stage provides an activation control signal, the bias point of the varactor is dynamically pushed to the area where the C(V) has significant change to produce phase shift versus power level. Since the varactor bias is dynamically pushed by the saturation detector of the power amplifier output stage, the varactor can be placed more aggressively in the variable C(V) curve section.

A pushed varactor using dynamic biasing will not create any unwanted phase shift at low and moderate power levels and will produce a sharper per-cycle capacitance and thus sharper phase pre-distortion at high signal levels.

A power amplifier may have one, two, three, or even more amplifying stages. The most common power amplifier implementation uses two stages, due to its gain in 30 dB to 36 dB range and the good efficiency.

At several points in the power amplifier signal path the APD AM-PM phase correction can be placed:

Placing the phase APD at the power amplifier output incurs the difficulties of creating large enough phase shifts due to the very large signal operation of the varactor, which in turn results in some amount of capacitance averaging per cycle, which reduces the delta_C capability. Furthermore, the power amplifier load can vary significantly in mobile applications, and the load voltage standing wave ratio (VSWR) significantly impacts the varactor action.

Placing the phase pre-distorter at the input of the power amplifier results in significant degradation of the VSWR presented to the transceiver.

The optimum placement of the APD phase pre-distorter is at the interstage (between the driver and the output stage). In the case of three or more stages, the APD phase pre-distorter is preferred to be placed between the last two stages. This provides isolation from the large power amplifier output signal and the load VSWR. Such placement also prevents impact on input VSWR. To get phase shift, the varactor needs reasonable signal level, which is available at the interstage point.

Figure 3A:
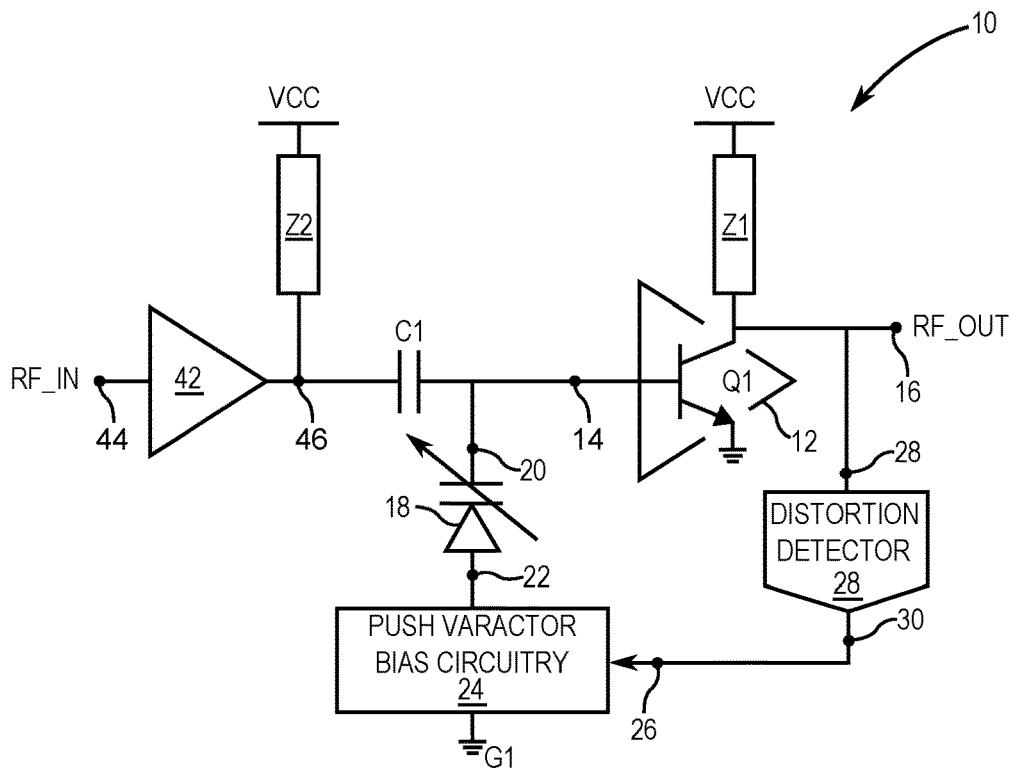
FIG. 3A is a diagram showing the placement of the pushed varactor amplitude modulation-phase modulation (AM-PM) correction before a coupling capacitor of the output stage.
Figure 3B:
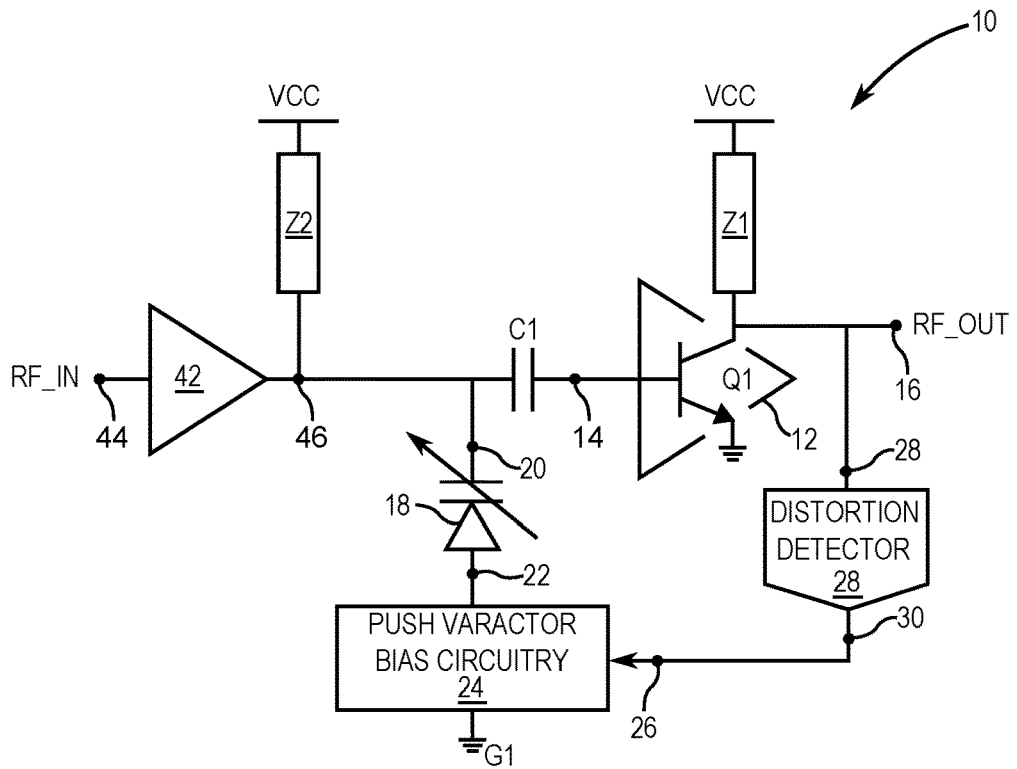
FIG. 3B is a diagram showing the placement of the pushed varactor AM-PM correction between the coupling capacitor and the output stage.

FIG. 3A and FIG. 3B show the placement of the pushed varactor AM-PM compensation. For example, FIG. 3A and FIG. 3B both depict an embodiment of the power amplifier system 10 having a driver stage 42 with a driver input 44 and a driver output 46. A coupling capacitor C1 couples the driver output 46 to the signal input 14. A second impedance element Z2 is coupled between the supply voltage rail VCC and the driver output 46. In a first option, depicted in FIG. 3A, the capacitance output 20 of the varactor 18 is direct current coupled to the signal input 14. In a second option, depicted in FIG. 3B, the capacitive output 20 is alternating current coupled to the signal input 14 by way of the coupling capacitor C1.

Choosing between these two options is also dependent on power amplifier integration and a partition between different dies: monolithic power amplifier with all stages in a single die, or multi-chip power amplifier implementation (e.g., hybrid complementary metal oxide semiconductor [CMOS]—bipolar implementations).

Note that placing the varactor 18 at the signal output 16 would make it prohibitively difficult to generate large C(V) variations due to the large signal averaging. On the other hand, coupling the capacitive output 20 of the varactor 18 to the driver input 44 of the driver stage 42 leads to capacitance changes due to varactor action to potentially negatively impact the input VSWR presented to a transceiver (not shown). Thus, the coupling of the capacitive output to a node between the driver 42 that is an interstage is a best placement for the pushed varactor AM-PM correction.

Multi-chip (hybrid) power amplifiers are now growing in popularity since they bring together the best of both worlds: the high ruggedness and high efficiency of the bipolar processes for the output stage and the tunability and adaptability/re-configurability of the CMOS process for the driver stage. In the case of hybrid CMOS-bipolar power amplifier (such as CMOS-GaAs power amplifiers), there are both CMOS varactors and bipolar varactors that can be used.

A standard varactor can be implemented in the CMOS front-end die since it does not need any signal line from the output stage. This is appropriate for phase correction of the driver stage. Bringing additional signal lines from the bipolar die to the CMOS die takes more area and is exposed to parasitic couplings.

Figure 4:
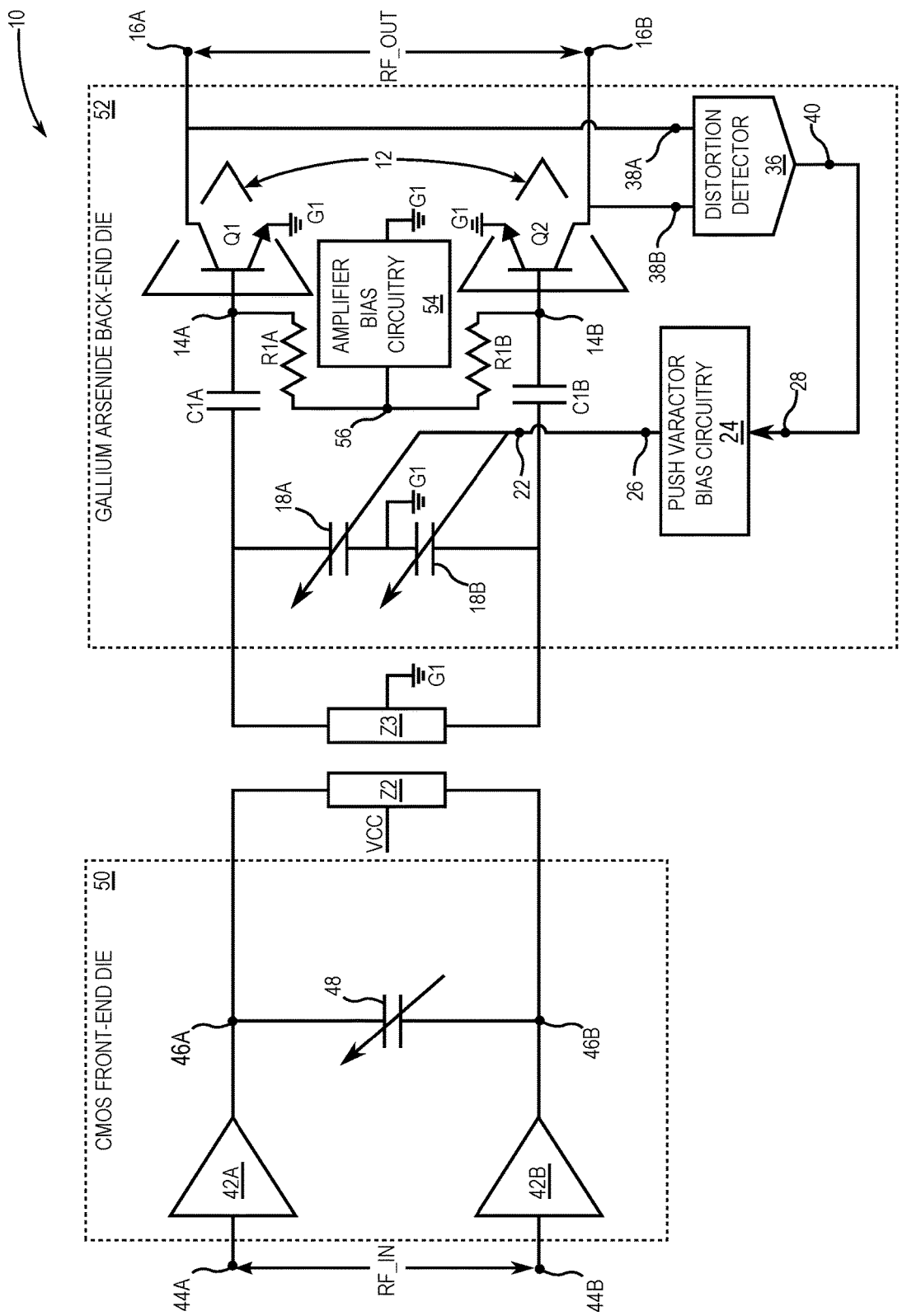
FIG. 4 is a diagram of an exemplary embodiment of the power amplifier system in the form of a differential power amplifier implemented with a hybrid complementary metal oxide semiconductor-gallium arsenide (CMOS-GaAs) architecture and choices for phase compensation varactor placement: CMOS varactor vs. bipolar varactor.

For phase correction of the power amplifier output stage, a desirable choice is to employ a dynamically biased pushed varactor implemented directly in the bipolar power amplifier back-end die, as shown in FIG. 4.

In the exemplary embodiment of FIG. 4, a CMOS front-end die 50 has a first driver stage 42A with a first driver input 44A and a first driver output 46A and a second driver stage 42B with a second driver input 44B and a second driver output 46B. A unipolar varactor diode 48 is coupled between the first driver output 46A and the second driver output 46B.

A gallium arsenide back-end die 52 includes the output amplifier stage 12 in differential form. A first transistor Q1 is configured to amplify positive portions of an RF signal entering a first signal input 14A, whereas a second transistor Q2 is configured to amplify negative portions of the RF signal entering a second signal input 14B. Amplifier bias circuitry 54 is configured to bias the first transistor Q1 and the second transistor Q2 during operation. The amplifier bias circuitry 54 is coupled between an amplifier bias output 56 and the fixed voltage node G1, which in this case is ground. A first bias voltage level is provided to the first transistor Q1 through a first bias resistor R1A that is coupled between the amplifier bias output 56 and the first signal input 14A. A second bias voltage level is provided to the second transistor Q2 through a second bias resistor R1B that is coupled between the amplifier bias output 56 and the second signal input 14B. A coupler constructed from a second impedance Z2 and a third impedance Z3 couples an amplified signal output from the CMOS front-end die 50 to the gallium arsenide back-end die 52. The supply voltage rail VCC couples to the first driver stage 42A and to the second stage 42B through the second impedance Z2.

An amplified version of the RF signal RF_OUT is provided between a first signal output 16A and a second signal output 16B of the gallium arsenide back-end die 52. Moreover, the distortion detector 36 has a first distortion detector input 38A coupled to the first signal output 16A and a second distortion detector input 38B coupled to the second signal output 16B. As with the previous embodiments, the distortion detection 36 has the distortion detector output 40 coupled to the bias control input 28 of the push varactor bias circuitry 24. However, in this exemplary embodiment, the bias level output 26 is coupled to the tuning input 22 that is shared between a first varactor 18A and a second varactor 18B. The first varactor 18A is coupled between the fixed voltage node G1 the first signal input 14A through a first coupling capacitor C1A. The second varactor 18B is coupled between the fixed voltage node G1 the second signal input 14B through a second coupling capacitor C1B.

To implement a dynamically biased varactor that starts the phase correction action when the power amplifier output stage starts distorting, a detector needs to be placed in the power amplifier output stage to sense when the stage starts so as to introduce distortion (e.g., soft compression). This is generally linked to the point when the collector-emitter voltage of the output devices goes below a certain threshold.

A fixed-biased varactor will start introducing phase shift at lower signal levels where it is not needed, producing some residual distortion. It is very difficult to produce a very sharp C(V) characteristic that compensates for the fast phase distortion when the power amplifier stage starts compressing.

The phase pre-distortion characteristic of the pushed first and second varactors 18A and 18B is accelerated by the distortion detector 36 and the optional control signal processing. In this way the push varactor bias circuitry 24 is inactive at low and moderate power levels when no phase correction is needed. Only when the output stage 12 starts distorting is the pushed varactor activated and starts correcting the phase distortion.

Figure 5:
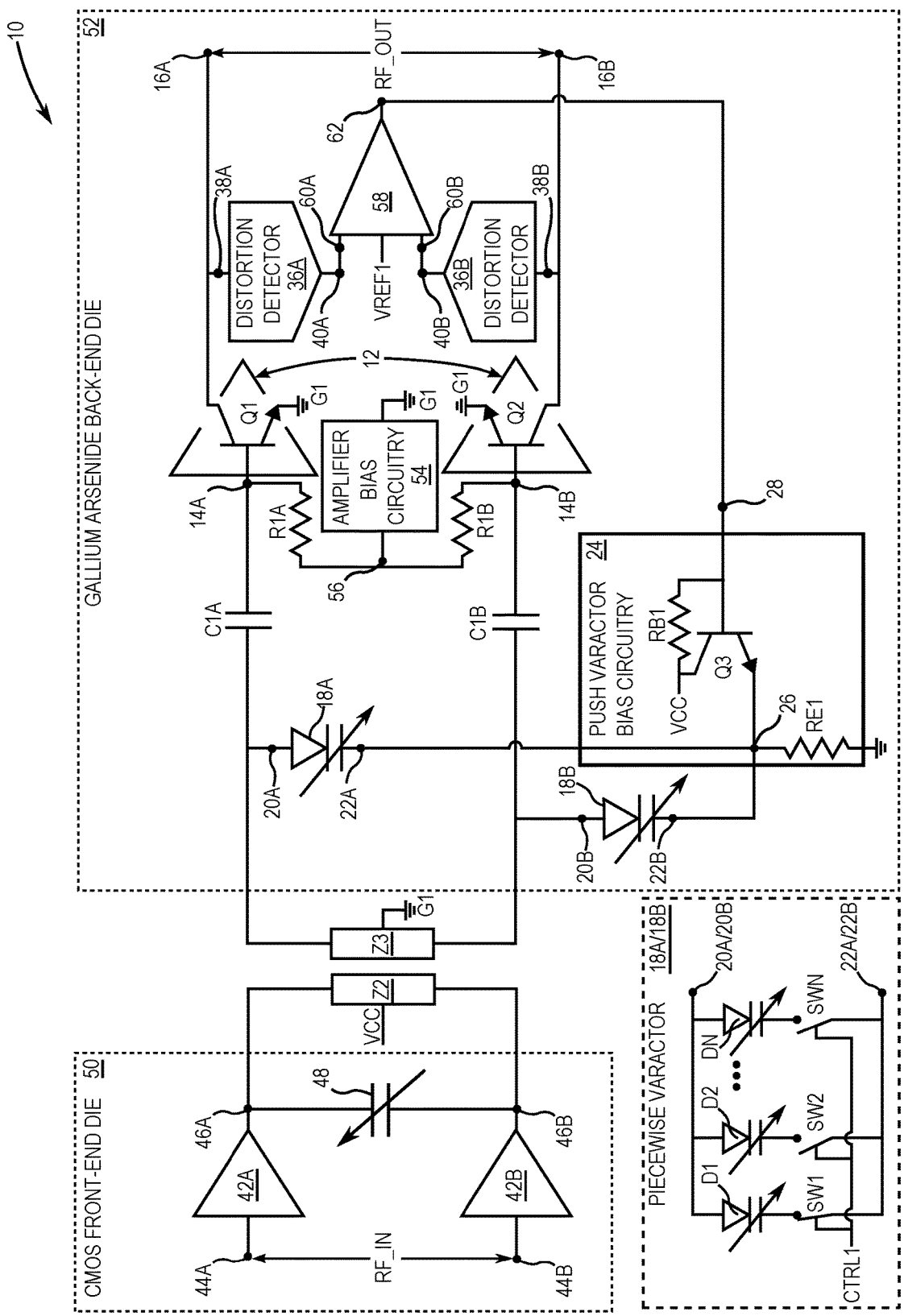
FIG. 5 is a diagram of an exemplary embodiment of the power amplifier system in a differential amplifier system that employs a comparator to direct compensation between a first output stage amplifier and a second output stage amplifier.

FIG. 5 depicts an embodiment of the power amplifier system 10 having yet another varactor dynamic biasing structure. In this exemplary embodiment, the gallium arsenide back-end die 52 includes a comparator 58 with a first comparator input 60A and a second comparator input 60B, a voltage reference VREF1, and a comparator output 62. The bias control input 28 of the push varactor bias circuitry 24 is coupled to the comparator output 62. In this embodiment, the first varactor 18A has an anode that is a first capacitive output 20A that is coupled to the first signal input 14A through the first coupling capacitor C1A. A first tuning input 22A, which is a cathode, is coupled to the bias level output 26. The second varactor 18B has an anode that is a second capacitive output 20B that is coupled to the second signal input 14B through the second coupling capacitor C1B. A second tuning input 22B that is a cathode is coupled to the bias level output 26.

In this exemplary embodiment, the push bias varactor circuitry 24 includes a third transistor Q3 having a base coupled to the bias control input 28 and a collector coupled to the base through a base bias resistor RB1. The collector of the third transistor Q3 is also coupled to the supply voltage rail VCC. An emitter of the third transistor Q3 is coupled to the bias level output 26. An emitter resistor RE1 couples the emitter of the third transistor Q3 and the bias level output 26 to the fixed voltage node G1, which in this exemplary case is ground.

A relatively high value of resistance for the emitter resistor is to float one side of the varactor. When one side is floating, no RF current can go through the varactor and its capacitance does not contribute to the phase shift. The detectors from the collectors of the output stage sense the VCE voltage of the output device. When such VCE goes below a given threshold, the device starts entering in pre-saturation, resulting in soft compression. An alert signal provided by the comparator will push low the cathodes of the first and second varactors 18A and 18B and allow RF current to circulate through the first and second varactors 18A and 18B to the fixed voltage node G1, which in this case is ground. This will result in varactor nonlinear capacitance to be seen in the power amplifier signal path that includes the first and second signal inputs 14A and 14B and thus generate analog phase pre-distortion.

The analog phase pre-distortion may be generated by a single varactor diode or it may have multiple diode branches. The diode varactors may have different sizes and include specific offset voltages that help implement a piecewise multi-shape C(V) and phase correction characteristic.

An inset of FIG. 5 depicts a variation of the first varactor 18A and the second varactor 18B that may be considered a piecewise varactor structure. Parallel branches made of series couplings of individual varactor diodes D1 and D2 through DN and individual switches SW1 and SW2 through SWN are coupled between the first capacitive output 20A or the second capacitive output 20B and the first tuning input 22A and the second tuning input 22B. The variable N is a counting number greater than 1. A control line CTRL1 controls the opening and closing of the switches SW1 through SWN. The control line CTRL1 may be coupled to a baseband processor (not shown). The baseband processor may choose to make any or all of the varactor diodes D1 and D2 through DN for during amplification of different communication bands. The exemplary depiction in the inset of FIG. 5 shows the first varactor diode D1 as being made active by closure of the first switch SW1. The remaining varactor diodes are not shown as being active due to the switches SW2 through SWN being open. Therefore, the control of the switches SW1 through SWN provides piecewise control of input capacitance of the output stage 12.

To get the phase APD phase correction implemented, there are several more building blocks that need to be introduced:
  A collector sensor that monitors the output device voltage
  A saturation replica bias voltage generator that creates the reference voltage which will indicate if the amplifying device is entering the distortion/saturation regime
  A saturation detector that compares the sensed collector voltage with the saturation reference threshold
  A varactor APD (phase APD) activation circuit which pushes the varactor dynamic bias such that it will start pre-distorting
  The actual pushed varactor with single or multiple branches These techniques can be applied to a variety of power amplifiers, including but not restricted to, the following:
  Single-ended power amplifiers
  Differential power amplifiers
  Quadrature power amplifiers
  Doherty power amplifiers
  Other load-modulated power amplifiers
  Distributed power amplifiers
  Arrays of power amplifiers (e.g., millimeter wave)

Figure 6:
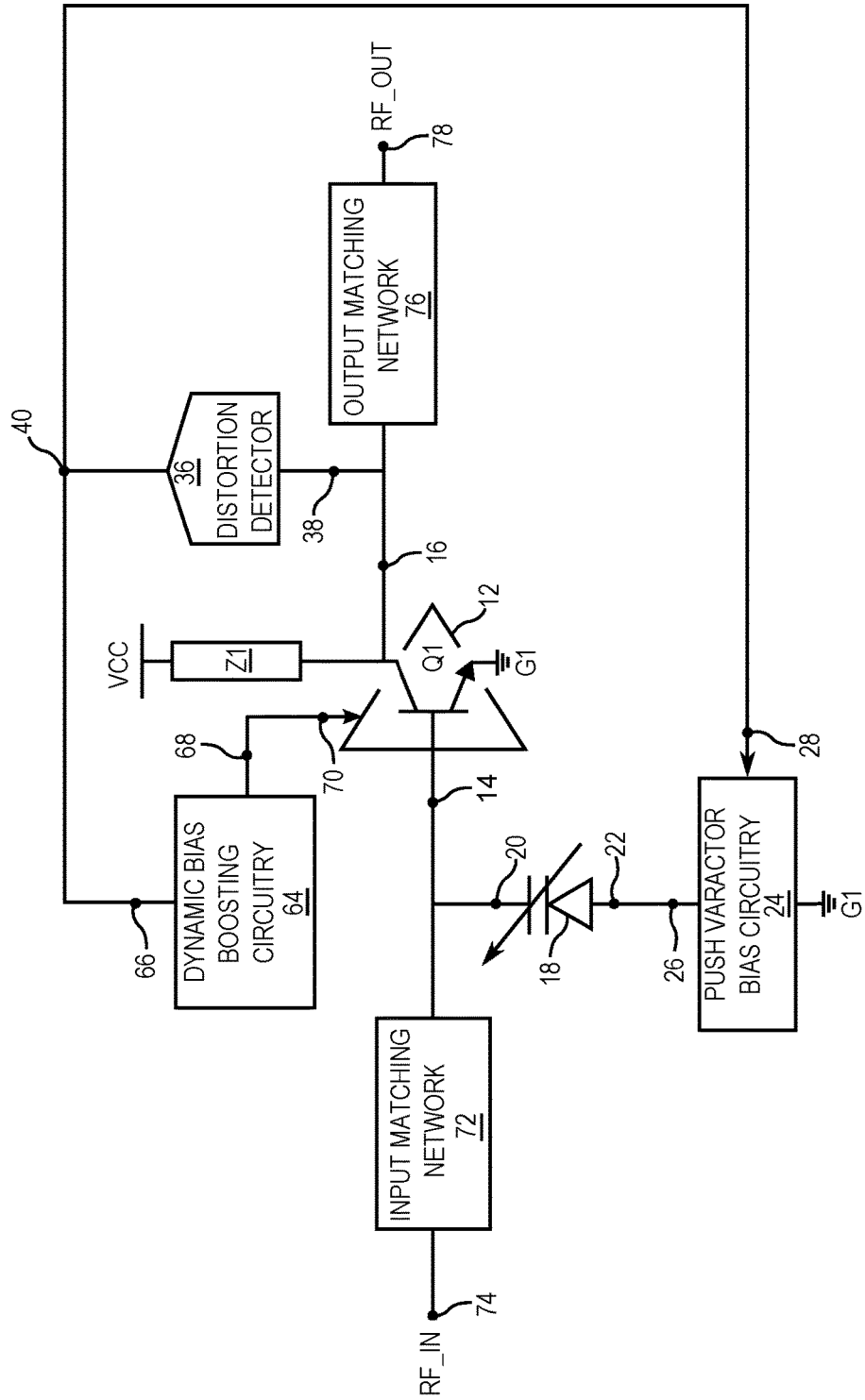
FIG. 6 is a diagram of an exemplary embodiment of a power amplifier system that employs pushed varactor AM-PM correction and further includes dynamic boosting circuitry to compensate for amplitude-amplitude modulation.

FIG. 6 depicts an embodiment of the power amplifier system 10 that employs the distortion detector 36 to compensate AM-AM distortion and AM-PM distortion. As depicted in FIG. 6, the power amplifier system 10 of this exemplary embodiment further includes dynamic bias boosting circuitry 64 having bias boost input 66 coupled to the distortion detector output 40, and a bias boost output 68 coupled to an amplifier bias input 70 of the output stage 12. Further included is an input matching network 72 that is coupled between an impedance matched input 74 and the signal input 14. An output matching network 76 is coupled between the signal output 16 and a matched output 78.

Figure 7:
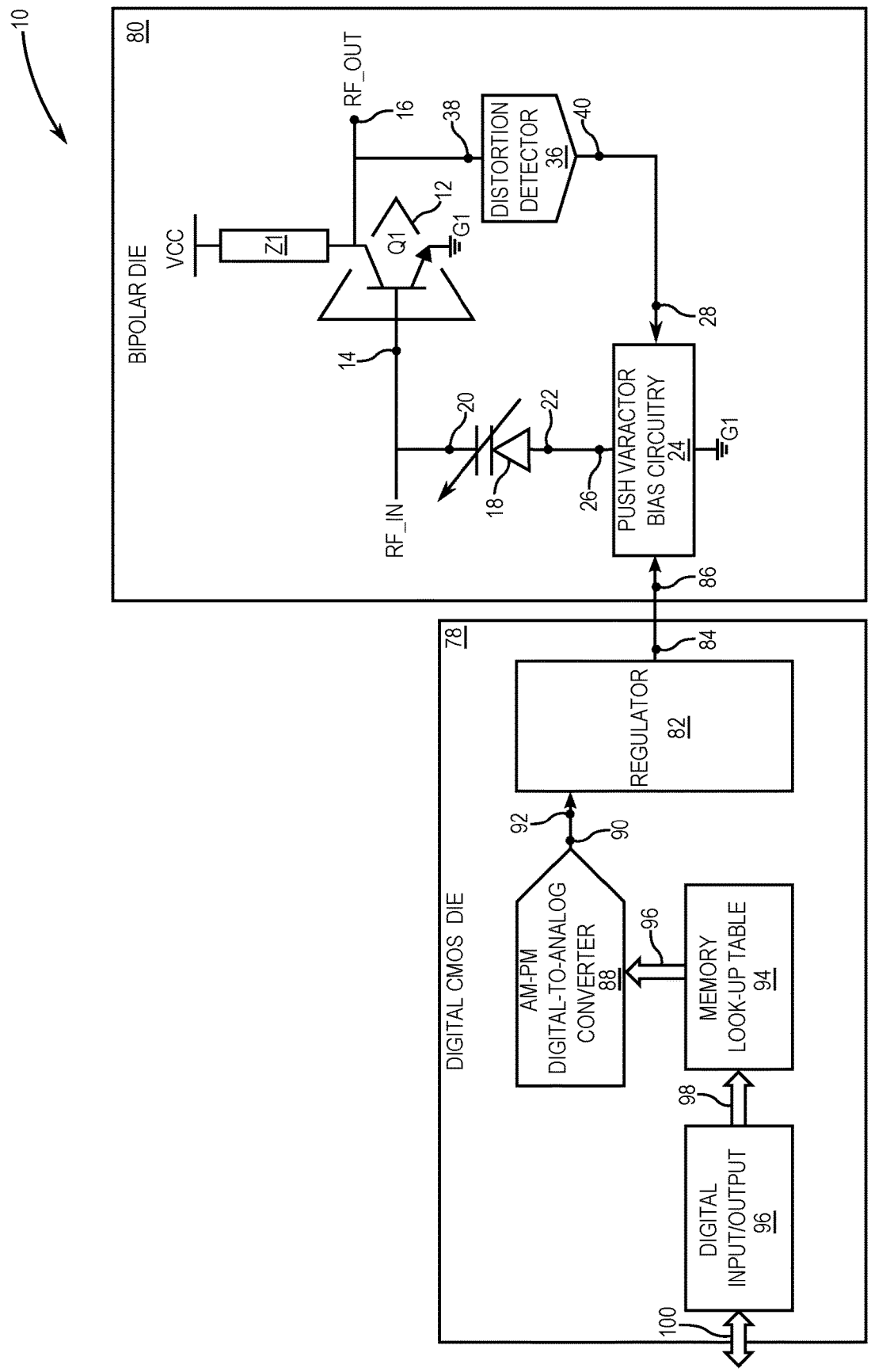
FIG. 7 is a diagram showing implementation of mixed-signal control to adjust the bipolar analog pre-distortion (APD) phase correction using existing analog lines between the power amplifier controller and the bipolar power amplifier die.

FIG. 7 shows implementation of mixed-signal control to adjust the bipolar APD phase correction using at least one existing analog line between a digital CMOS die 78 that is configured as a power amplifier controller and a bipolar power amplifier die 80 that includes the output stage 12, the distortion detector 36, push varactor circuitry 24, and the varactor 18. The digital CMOS die 78 has a regulator 82 that has a regulated output 84 coupled to a regulated input 86 of the push varactor bias circuitry 24. An AM-PM digital-to-analog converter 88 has a converter output 90 coupled to a regulator control input 92 of the regulator 82. A memory lookup table 94 is configured to communicate with the AM-PM digital-to-analog converter 88 over a first digital bus 96 and to communicate with digital input/output buffer 96 over a second digital bus 98. The digital input/output buffer 96 is configured to communicate over a third digital bus 100 with an external baseband processor (not shown).

The power amplifier phase distortion varies significantly with the band of operation, or even with the sub-band of operation, because of the interaction between the power amplifier and the post-power amplifier filter. Therefore, it is desirable to have the APD phase correction be adjustable as a function of band or sub-band of operation.

It is generally difficult to implement digital circuits in the bipolar power amplifier die. It is, however, relatively easy to implement digital and mixed signal (e.g., digital-to-analog [DAC]) circuits in the CMOS front-end die. A digital interface is available and the baseband can communicate with the power amplifier front-end die the band or sub-band of operation. Various APD phase correction coefficients can be saved in a front-end module (FEM) local memory, which can be retrieved based on the band or sub-band of operation. A DAC circuit can transform the saved phase APD coefficient in an analog voltage that can be conveyed to the bipolar power amplifier back-end die to influence the pushed varactor phase correction.

The 5G communications have much more stringent requirements on the power amplifier linearity. Achieving the 5G adjacent channel leakage ratio (ACLR) mandates that the back-off plateau is around −45 dB. Being just around −40 dB is no longer acceptable. This puts hard constraints on the power amplifier phase linearization.

Figure 8:
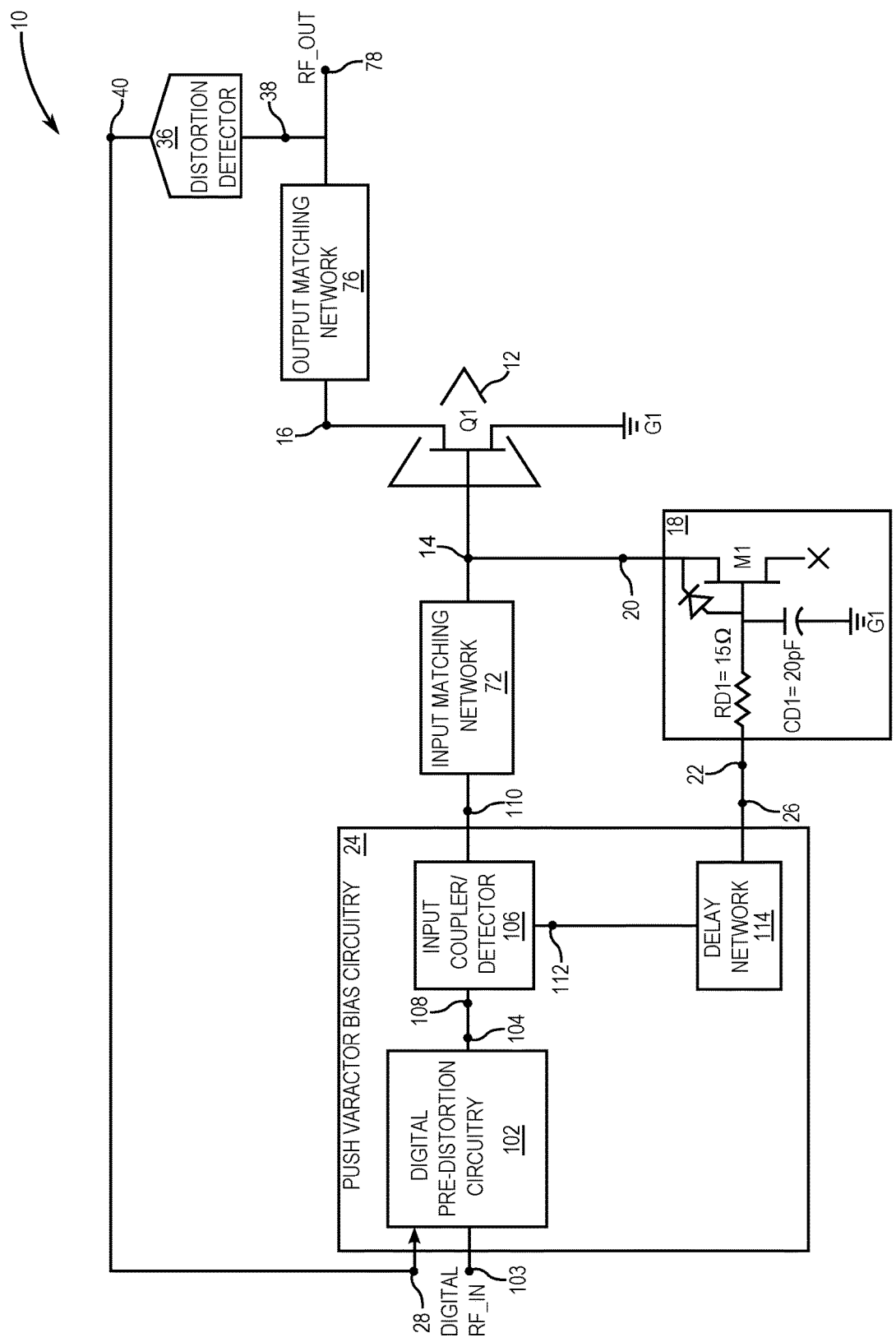
FIG. 8 is a diagram showing an alternate transmit path linearization using baseband digital pre-distortion (DPD) and front-end analog phase APD correction with input coupler, controlled delay, detector, and APD linearization path.

FIG. 8 shows an alternate transmit path linearization using baseband distortion pre-distortion (DPD) and front-end analog phase APD correction. In this exemplary embodiment, the push varactor circuitry 24 includes digital pre-distortion circuitry 102 that is configured to receive an RF signal through a digital RF input 103 and output a pre-distorted RF signal through an RF analog output 104. The digital pre-distortion circuitry 102 is further configured to receive at the digital pre-distortion circuitry 102 a distortion signal generated by the distortion detector 36. The digital pre-distortion circuitry 102 has typical elements that include, but are not limited to, mixers, digital-to-analog converters, and lookup tables. A difference from typical DPD circuitry is that the digital pre-distortion circuitry 102 is configured to further adjust the predistorted RF signal in response to the diction signal generated by the distortion detector 36.

The push varactor bias circuitry 24 further includes an input coupler/detector 106 having a coupler input 108 coupled to the RF analog output 104. A coupler output 110 is coupled to the signal input 14 through the input matching network 72. The input coupler/detector 106 further includes a detector output 112 through which a varactor bias level signal is transmitted to the tuning input 22 of the varactor 18. A delay network 114 within an APD linearization path is coupled between the detector output 112 and the tuning input 22 through the bias level output 26 and is configured to synchronize the bias level signal in the APD linearization path with the RF signal within a signal path that includes the signal input 14.

There are multiple ways of controlling the dual APD correction path. A dual path with a coupler/detector and a delay compensation network can be implemented to control and generate analog pre-distortion. Thus, APD can be combined with the DPD, resulting in a hybrid DPD-APD linearization or an analog-assisted DPD, depending on the importance of the APD component.

Figure 9:
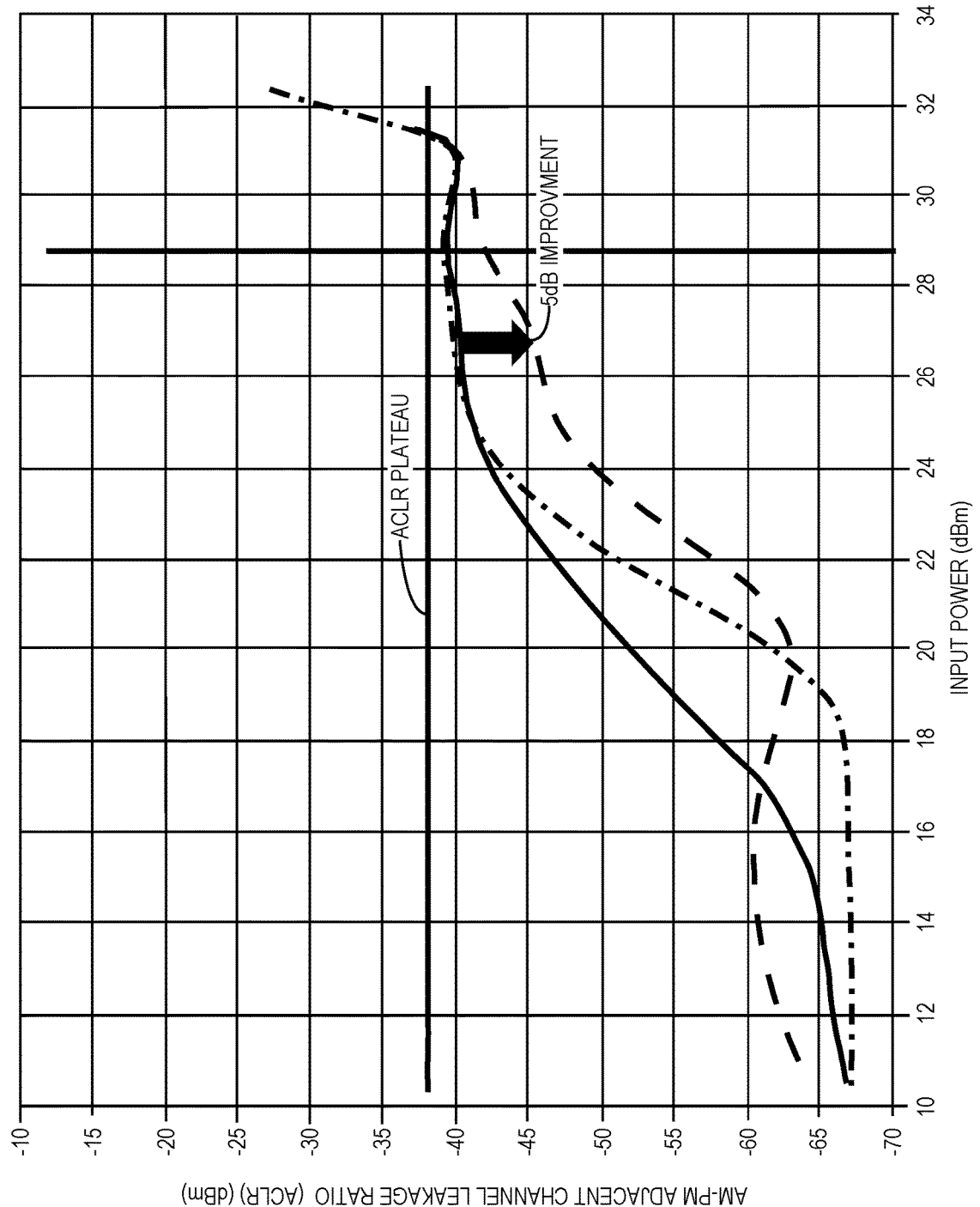
FIG. 9 is a graph showing an example of a power amplifier PM-only adjacent channel leakage ratio improvement using phase APD.
Figure 10:
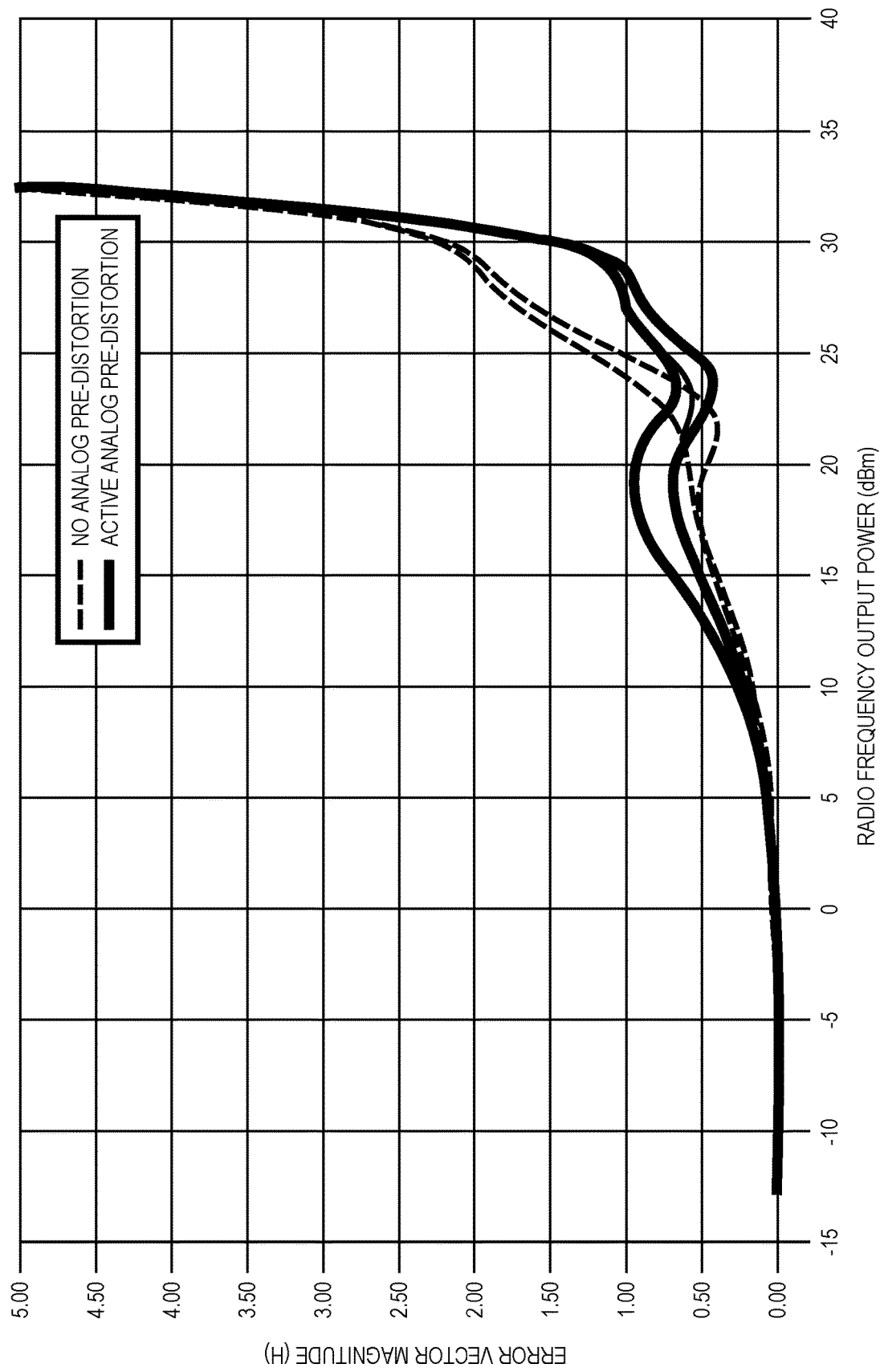
FIGS. 10 and 11 are graphs showing power amplifier error vector magnitude without APD (dashed trace) and with APD (solid trace) showing significant improvement in the medium-to-high power range (20 dBm to 32 dBm).
Figure 11:
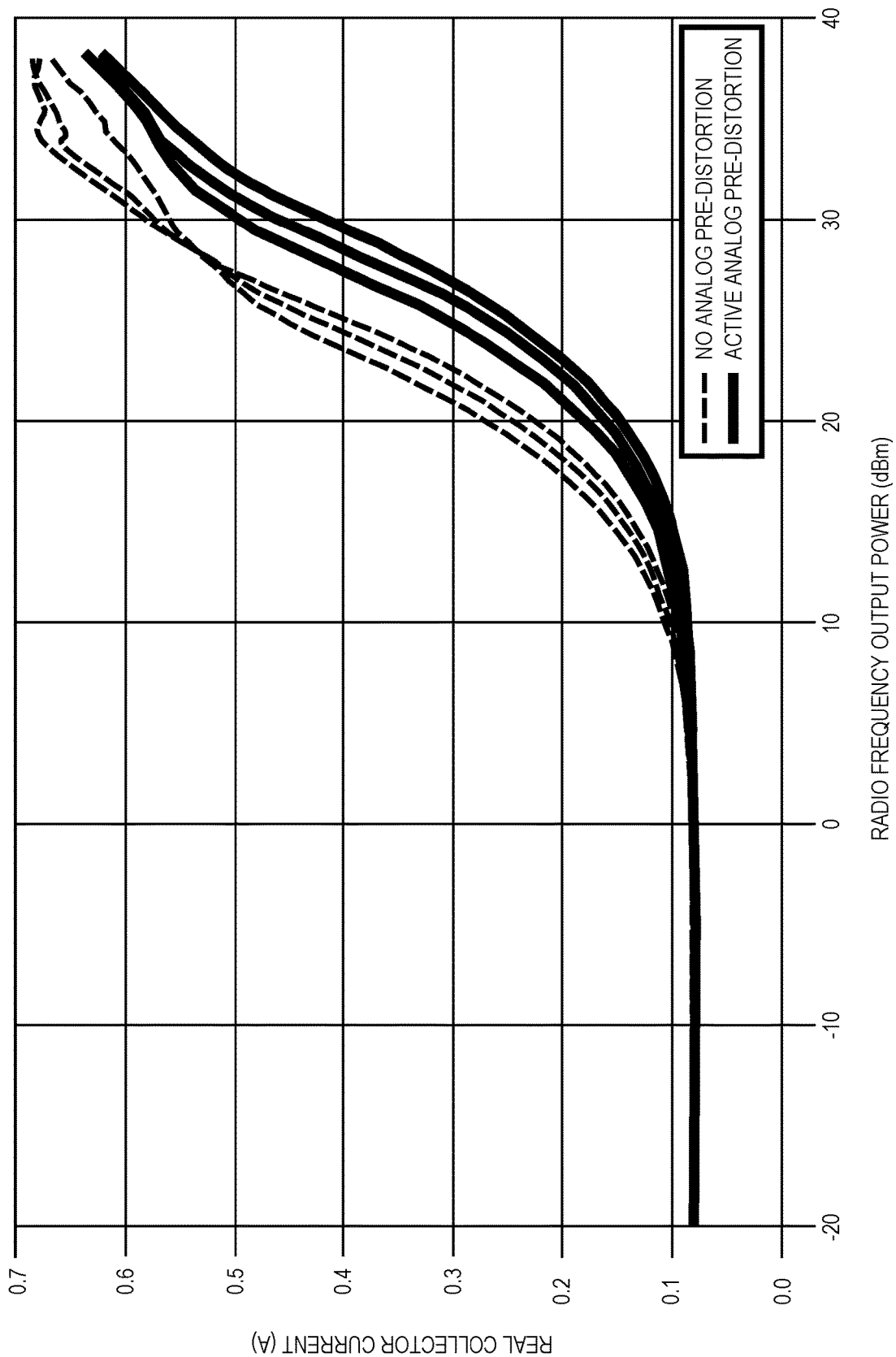
Figure 12:
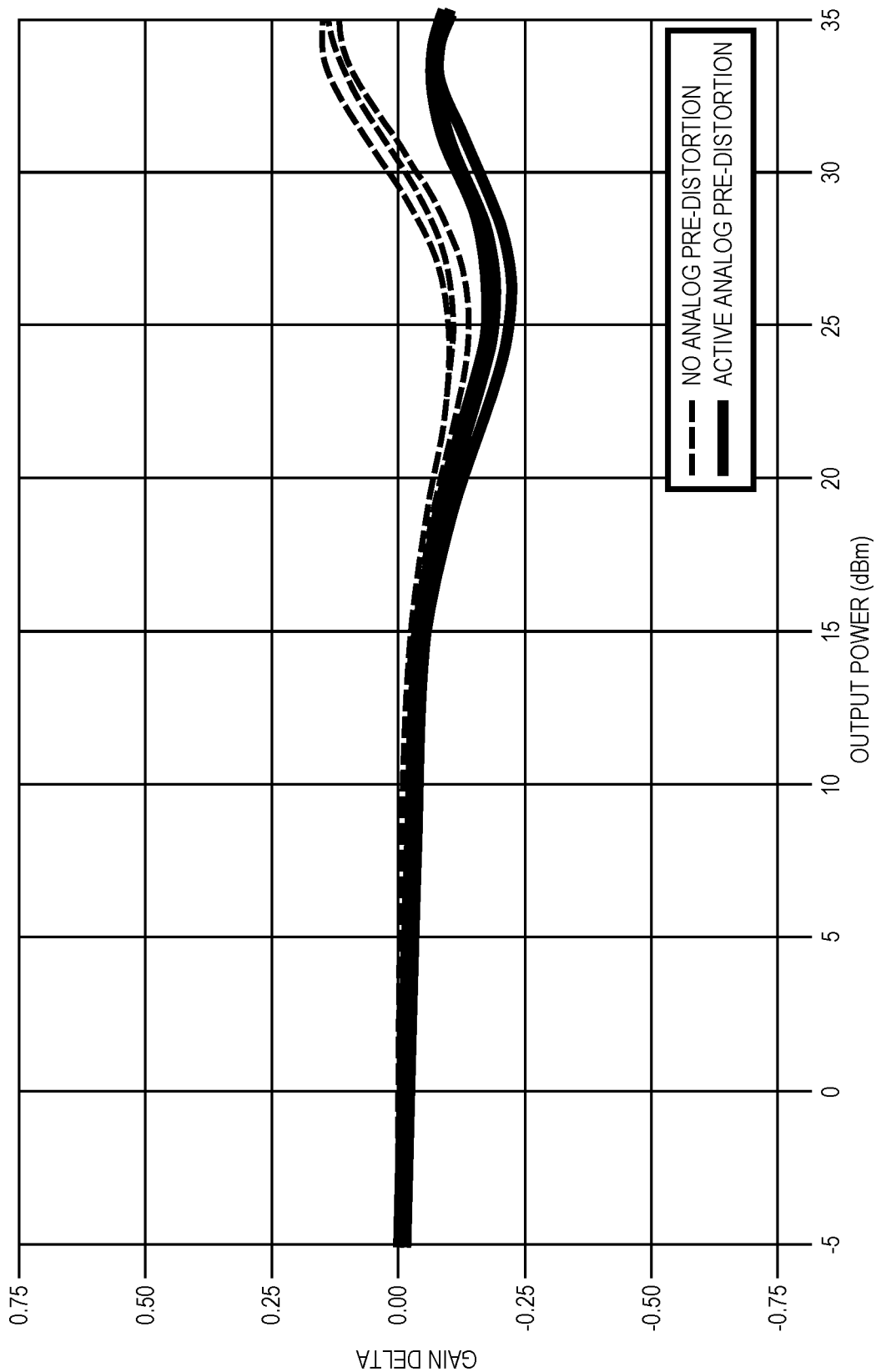
FIGS. 12 and 13 are graphs showing amplitude modulation-amplitude modulation (AM-AM) gain curves and AM-PM phase curves without APD (dashed curves) with APD (solid curves) showing the impact of the direct power amplifier APD.
Figure 13:
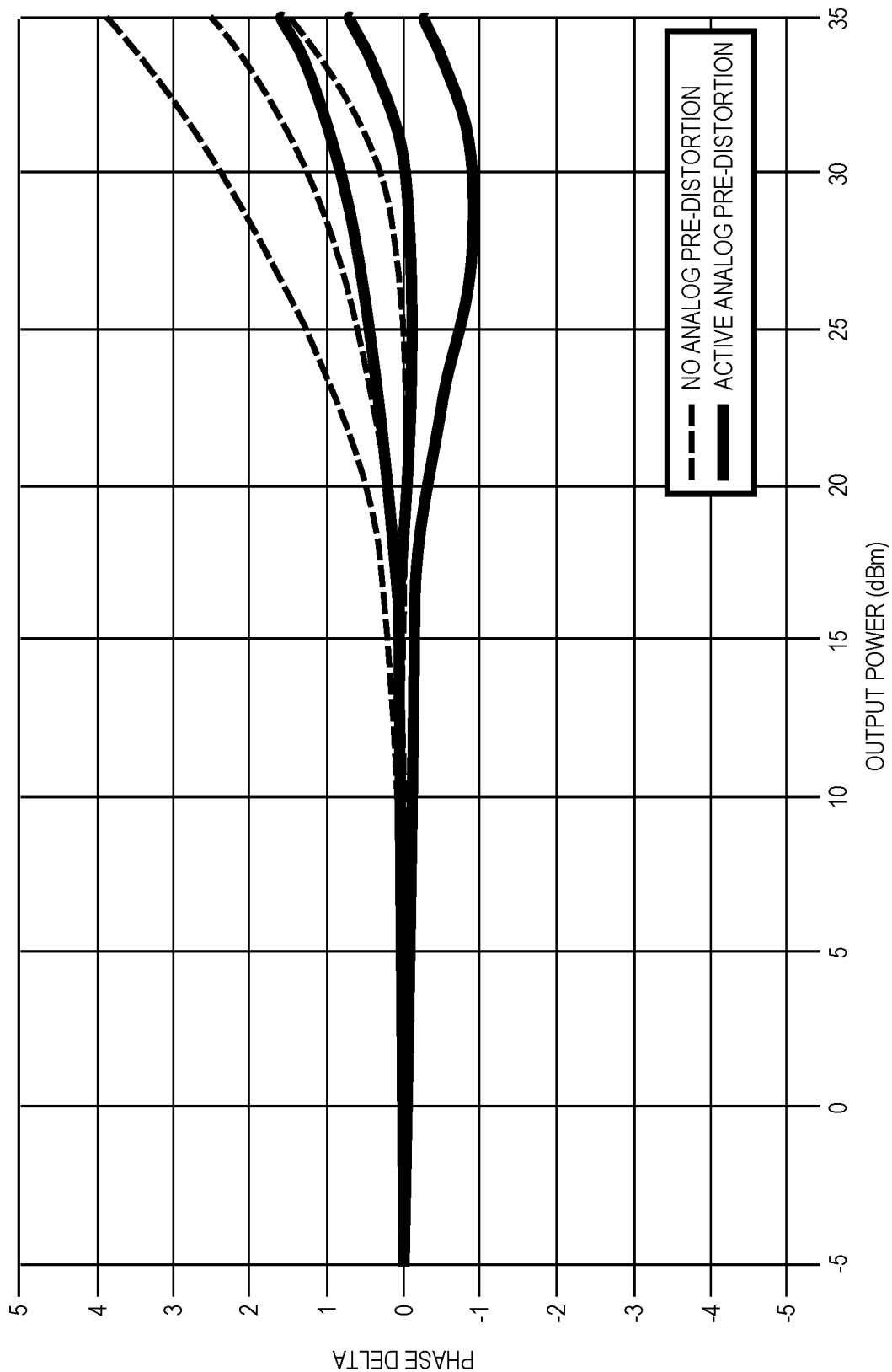

FIG. 9 illustrates one example of analog phase correction that provides the needed 5 dB boost in back-off ACLR plateau. The APD phase correction according to the present disclosure can be implemented in a variety of power amplifier processes, such as the following:
silicon germanium (SiGe) heterojunction bipolar transistor (HBT), indium phosphide HBT
GaAs HBT
GaN FET As shown in FIGS. 10 and 11, there is significant error vector magnitude (EVM) improvement in the back-off plateau. The EVM slope at relatively higher power signals is not changed, but the level before the final slope is considerably improved. FIGS. 12 and 13 show the AM-AM and AM-PM curves with and without APD, again illustrating the correction action of the APD.

Figure 14:
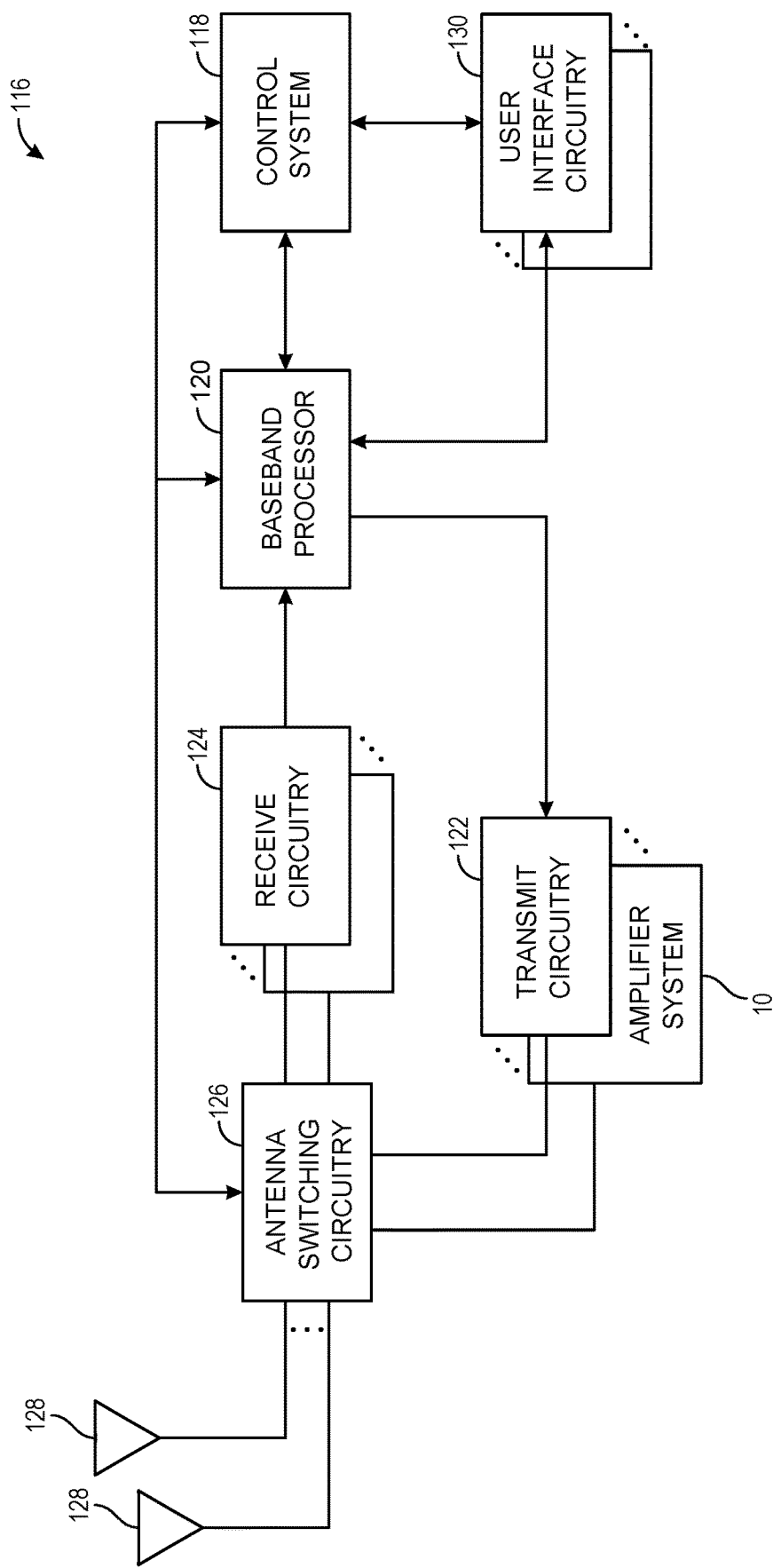
FIG. 14 is a diagram showing how the disclosed power amplifier system may interact with user elements such as wireless communication devices.

With reference to FIG. 14, the concepts described above may be implemented in various types of wireless communication devices or user elements 116, such as mobile terminals, smart watches, tablets, computers, navigation devices, access points, and the like that support wireless communications, such as cellular, wireless local area network (WLAN), Bluetooth, and near-field communications. The user elements 116 will generally include a control system 118, a baseband processor 120, transmit circuitry 122 that includes the power amplifier system 10, receive circuitry 124, antenna switching circuitry 126, multiple antennas 128, and user interface circuitry 130. The receive circuitry 124 receives radio frequency signals via the antennas 128 and through the antenna switching circuitry 126 from one or more basestations. A low-noise amplifier and a filter (not shown) cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 120 processes the digitized received signal to extract the information or data bits conveyed in the received signal. This processing typically comprises demodulation, decoding, and error correction operations. The baseband processor 120 is generally implemented in one or more digital signal processors (DSPs) and application-specific integrated circuits (ASICs).

For transmission, the baseband processor 120 receives digitized data, which may represent voice, data, or control information, from the control system 38, which it encodes for transmission. The encoded data are output to the transmit circuitry 122, where they are used by a modulator (not shown) to modulate a carrier signal that is at a desired transmit frequency or frequencies. A power amplifier (not shown) will amplify the modulated carrier signal to a level appropriate for transmission and deliver the modulated carrier signal to the antennas 128 through the antenna switching circuitry 126. The antennas 128 and the replicated transmit and receive circuitries 122, 124 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An amplifier system comprising:
an output amplifier stage having a signal input and a signal output;
a varactor having a capacitive output coupled to the signal input, and a tuning input;
push varactor bias circuitry having a bias level output coupled to the tuning input and a bias control input, wherein the push varactor bias circuitry is configured to adjust bias voltage at the tuning input and thereby adjust capacitance at the signal input and reduce signal distortion at the signal output in response to a distortion compensation signal received at the bias control input.

2. The amplifier system of claim 1 further comprising a power detector having a detector input coupled to the signal input and a detector output coupled to the bias control input, wherein the power detector is configured to generate the distortion compensation signal based on a detection of an input signal at the signal input.

3. The amplifier system of claim 1 further comprising a distortion detector having a detector input coupled to the signal out and a detector output coupled to the bias control input, wherein the distortion detector is configured to generate the distortion compensation signal based on a distortion measurement of an amplified signal at the signal output.

4. The amplifier system of claim 1 further comprising:
a distortion detector having a detector input coupled to the signal output, and a detector output; and
a digital pre-distortion processor having a feedback input coupled to the detector output and a pre-distortion output coupled to the bias control input and a radio frequency (RF) signal input, wherein the digital pre-distortion processor is configured to pre-distort an RF signal arriving at the RF input and to generate the distortion compensation signal based on a distortion measurement of an amplified signal at the signal output.

5. The amplifier system of claim 1 further comprising a plurality of varactors each having a first capacitive output coupled to the signal input of the output amplifier stage, and a tuning input coupled to a corresponding one of a plurality of bias level outputs comprising the push varactor bias circuitry, wherein the push varactor bias circuitry is further configured to piecewise adjust bias voltages at the tuning input of each of the plurality of varactors and thereby adjust capacitance at the signal input to reduce signal distortion at the signal output in response to a distortion compensation signal received at the bias control input.

6. The amplifier system of claim 1 wherein the output amplifier stage is of the differential amplifier type comprising a positive amplifier having a positive input coupled to the signal input and a negative amplifier having a negative signal input and further comprising a second varactor having a second capacitive output coupled to the negative signal input and a second tuning input coupled to the bias level output of the push varactor bias circuitry.

7. The amplifier system of claim 1 further comprising a driver stage having a driver output coupled to the signal input of the output amplifier stage.

8. The amplifier system of claim 7 wherein the output amplifier stage is fabricated on a gallium arsenide die and the driver stage is fabricated on a complementary metal oxide semiconductor die.

9. The amplifier system of claim 1 wherein the varactor is a voltage-controlled varactor.

10. A method for reducing signal distortion in an amplifier system having an output amplifier stage having a signal input and a signal output, a varactor having a first capacitive output coupled to the signal input and a tuning input, and push varactor bias circuitry having a bias level output coupled to the tuning input and a bias control input, the method comprising:
   receiving a distortion compensation signal at the bias control input;
   adjusting bias voltage at the tuning input with the push varactor bias circuitry in response to the distortion compensation signal to adjust capacitance at the signal input; and
   reducing signal distortion at the signal output of the output amplifier stage by way of the adjusted capacitance at the signal input.

11. The method for reducing signal distortion in the amplifier system of claim 10 further comprising a power detector having a detector input coupled to the signal input and a detector output coupled to the bias control input, the method further comprising:
   detecting an input signal at the signal input of the output amplifier stage with the power detector; and
   generating by way of the power detector, the distortion compensation signal based on the detection of the input signal by the distortion detector.

12. The method for reducing signal distortion in the amplifier system of claim 10 further comprising a distortion detector having a detector input coupled to the signal output and a detector output coupled to the bias control input, the method further comprising:
   detecting an input signal at the signal input of the output amplifier stage with the distortion detector; and
   generating by way of the distortion detector the distortion compensation signal based on a distortion measurement of an amplified signal at the signal output.

13. The method for reducing signal distortion in the amplifier system of claim 12 further comprising a pre-distortion processor having a feedback input coupled to the detector output and a pre-distortion output coupled to the bias control input, and a radio frequency input, the method further comprising:
   receiving an RF signal at the RF signal input;
   amplifying the RF signal to generate an amplified signal at a signal output of the output amplifier stage;
   detecting distortion in the amplified signal by way of the distortion detector;
   feeding back the distortion measurement to the digital pre-distortion processor;
   pre-distorting the RF signal arriving at the RF input by way of the digital pre-distortion processor; and
   generating by way of the pre-distortion processor the distortion compensation signal based on the distortion measurement of the amplified signal at the signal output.

14. The method for reducing signal distortion in the amplifier system of claim 10 further comprising a plurality of varactors, each having a capacitive output coupled to the signal input of the output amplifier stage, and a tuning input coupled to a corresponding one of a plurality of bias level outputs comprising the push varactor bias circuitry, the method comprising:
   receiving a distortion compensation signal at a bias control input; and
   piecewise adjusting the bias voltages at the tuning input of each of the plurality of varactors using the push varactor bias circuitry, thereby adjusting capacitance at the signal input to reduce signal distortion at the signal output.

15. The method for reducing signal distortion in the amplifier system of claim 10, the amplifier system comprising a signal input, a differential output amplifier stage comprising a positive amplifier with a positive input coupled to the signal input and a negative amplifier with a negative signal input, and a second varactor having a second capacitive output coupled to the negative signal input and a second tuning input coupled to a bias level output of push varactor bias circuitry, the method comprising:
   providing a bias voltage to the bias level output of the push varactor bias circuitry;
   receiving a signal at the signal input;
   adjusting the capacitance at the signal input by adjusting the bias voltage at the second tuning input of the second varactor using the push varactor bias circuitry; and
   amplifying the received signal using the differential amplifier type output amplifier stage to generate an amplified output signal.

16. The method for reducing signal distortion in the amplifier system of claim 10, the amplifier system further comprising a driver stage having a driver output coupled to the signal input of the output amplifier stage.

17. The method for reducing signal distortion in the amplifier system of claim 16 wherein the output amplifier stage is fabricated on a gallium arsenide die and the driver stage is fabricated on a complementary metal oxide semiconductor die.

18. The method for reducing signal distortion in the amplifier system of claim 10 wherein the varactor is a voltage-controlled varactor.

19. An amplifier system comprising:
   an output amplifier stage having a signal input and a signal output;
   a varactor having a capacitive output coupled to the signal input, and a tuning input;
   push varactor bias circuitry having a bias level output coupled to the tuning input and a bias control input, wherein the push varactor bias circuitry is configured to adjust bias voltage at the tuning input and thereby adjust capacitance at the signal input and reduce signal distortion at the signal output in response to a distortion compensation signal received at the bias control input.

20. A wireless communication device comprising:
a baseband processor;
transmit circuitry configured to receive encoded data from the baseband processor and to modulate a carrier signal with the encoded data, wherein the transmit circuitry comprises:
   an output amplifier stage having a signal input and a signal output;
   a varactor having a first capacitive output coupled to the signal input, and a tuning input;
   push varactor bias circuitry having a bias level output coupled to the tuning input and a bias control input, wherein the push varactor bias circuitry is configured to adjust bias voltage at the tuning input and thereby adjust capacitance at the signal input and reduce signal distortion at the signal output in response to a distortion compensation signal received at the bias control input.

21. The wireless communication device of claim 20 further comprising a power detector having a detector input coupled to the signal input and a detector output coupled to the bias control input, wherein the power detector is configured to generate the distortion compensation signal based on a detection of an input signal at the signal input.

22. The wireless communication device of claim 20 further comprising a distortion detector having a detector input coupled to the signal output and a detector output coupled to the bias control input, wherein the distortion detector is configured to generate the distortion compensation signal based on a distortion measurement of an amplified signal at the signal output.

23. The wireless communication device of claim 20 further comprising:
   a distortion detector having a detector input coupled to the signal output, and a detector output; and
   a digital pre-distortion processor having a feedback input coupled to the detector output and a pre-distortion output coupled to the bias control input and a radio frequency (RF) signal input, wherein the digital pre-distortion processor is configured to pre-distort an RF signal arriving at the RF input and to generate the distortion compensation signal based on a distortion measurement of an amplified signal at the signal output.

24. The wireless communication device of claim 20 further comprising a plurality of varactors each having a capacitive output coupled to the signal input of the output amplifier stage, and a tuning input coupled to a corresponding one of a plurality of bias level outputs comprising the push varactor bias circuitry, wherein the push varactor bias circuitry is further configured to piecewise adjust bias voltages at the tuning input of each of the plurality of varactors and thereby adjust capacitance at the signal input to reduce signal distortion at the signal output in response to a distortion compensation signal received at the bias control input.

25. The wireless communication device of claim 20 wherein the output amplifier stage is of the differential amplifier type comprising a positive amplifier having a positive input coupled to the signal input and a negative amplifier having a negative signal input and further comprising a second varactor having a second capacitive output coupled to the negative signal input and a second tuning input coupled to the bias level output of the push varactor bias circuitry.

26. The wireless communication device of claim 20 further comprising a driver stage having a driver output coupled to the signal input of the output amplifier stage.

27. The wireless communication device of claim 26 wherein the output amplifier stage is fabricated on a gallium arsenide die and the driver stage is fabricated on complementary metal oxide semiconductor die.

28. The wireless communication device of claim 20 wherein the varactor is a voltage-controlled varactor.

* * * * *